United States Patent
Takahashi et al.

(10) Patent No.: US 8,911,128 B2
(45) Date of Patent: Dec. 16, 2014

(54) LIGHT PROJECTION UNIT AND LIGHT PROJECTION DEVICE

(75) Inventors: Koji Takahashi, Osaka (JP); Yoshiyuki Takahira, Osaka (JP); Yosuke Maemura, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 131 days.

(21) Appl. No.: 13/452,359

(22) Filed: Apr. 20, 2012

(65) Prior Publication Data

US 2012/0275174 A1 Nov. 1, 2012

(30) Foreign Application Priority Data

Apr. 28, 2011 (JP) .................... 2011-101973
Jan. 25, 2012 (JP) .................... 2012-013321

(51) Int. Cl.
*B60Q 1/00* (2006.01)
*B60Q 3/00* (2006.01)
(Continued)

(52) U.S. Cl.
CPC ............ *H01S 5/4012* (2013.01); *B82Y 20/00* (2013.01); *H01S 5/005* (2013.01); *F21S 48/1145* (2013.01); *F21S 48/1241* (2013.01); *H01S 5/02208* (2013.01); *H01S 5/02476* (2013.01); *H01S 5/2036* (2013.01); *H01S 5/22* (2013.01); *H01S 5/34333* (2013.01); *H01S 5/4031* (2013.01)
USPC ............. 362/538; 362/84; 362/259; 362/553; 362/510; 362/511

(58) Field of Classification Search
USPC ......... 362/84, 235, 259, 296.01, 296.05, 297, 362/298, 300, 307, 311.01, 311.03, 311.06, 362/327, 459, 509–511, 516, 538, 551, 553, 362/554

See application file for complete search history.

(56) References Cited

U.S. PATENT DOCUMENTS

| 4,688,884 | A | * | 8/1987 | Scifres et al. ................... 385/38 |
| 5,278,731 | A | | 1/1994 | Davenport et al. |

(Continued)

FOREIGN PATENT DOCUMENTS

| CN | 102121651 | 7/2011 |
| EP | 2 518 560 | 10/2012 |

(Continued)

OTHER PUBLICATIONS

Takashi, K. et al. (2011). "'Laser headlight' for Next Generation Automotive Lighting," *9th International Symposium on Automotive Lighting*. 271-283.

*Primary Examiner* — Robert May
*Assistant Examiner* — Alexander Garlen
(74) *Attorney, Agent, or Firm* — Morrison & Foerster LLP

(57) ABSTRACT

A light projection unit is provided that can reduce the production of a portion where the light density is excessively increased on a fluorescent member. This light projection unit includes: a light collection member that includes a light entrance surface and a light emission surface which has an area smaller than that of the light entrance surface; a fluorescent member that includes an application surface to which the laser light emitted from the light collection member is applied and that mainly emits fluorescent light from the application surface; and a light projection member that projects the fluorescent light. The light emission surface of the light collection member is arranged a predetermined distance from the application surface of the fluorescent member.

19 Claims, 22 Drawing Sheets

(51) Int. Cl.

| | |
|---|---|
| *F21V 9/16* | (2006.01) |
| *G02B 27/20* | (2006.01) |
| *F21V 7/04* | (2006.01) |
| *G01S 1/00* | (2006.01) |
| *G09B 9/00* | (2006.01) |
| *H01S 3/00* | (2006.01) |
| *H01S 3/30* | (2006.01) |
| *F21V 9/00* | (2006.01) |
| *F21V 11/00* | (2006.01) |
| *H01S 5/40* | (2006.01) |
| *B82Y 20/00* | (2011.01) |
| *H01S 5/00* | (2006.01) |
| *F21S 8/10* | (2006.01) |
| *H01S 5/022* | (2006.01) |
| *H01S 5/024* | (2006.01) |
| *H01S 5/20* | (2006.01) |
| *H01S 5/22* | (2006.01) |
| *H01S 5/343* | (2006.01) |

(56) References Cited

U.S. PATENT DOCUMENTS

| | | | |
|---|---|---|---|
| 5,515,243 A * | 5/1996 | Cassarly et al. | 362/560 |
| 7,165,871 B2 * | 1/2007 | Takeda et al. | 362/538 |
| 7,356,054 B2 * | 4/2008 | Hama et al. | 372/21 |
| 2005/0105301 A1 | 5/2005 | Takeda et al. | |
| 2006/0153257 A1 | 7/2006 | Franjic et al. | |
| 2009/0003400 A1 | 1/2009 | Nagahama et al. | |
| 2009/0052189 A1 | 2/2009 | Kon | |
| 2009/0147529 A1 | 6/2009 | Ajiki et al. | |
| 2011/0044070 A1 * | 2/2011 | Takahashi | 362/553 |
| 2011/0148280 A1 | 6/2011 | Kishimoto et al. | |

FOREIGN PATENT DOCUMENTS

| | | |
|---|---|---|
| JP | 6-203606 | 7/1994 |
| JP | 7-318998 | 12/1995 |
| JP | 2003-295319 | 10/2003 |
| JP | 2004-241142 | 8/2004 |
| JP | 2005-150041 | 6/2005 |
| JP | 2007-242717 | 9/2007 |
| JP | 2007-323858 | 12/2007 |
| JP | 2008-234908 | 10/2008 |
| JP | 2009-180935 | 8/2009 |
| JP | 2010-153241 | 7/2010 |
| JP | 2010-232044 | 10/2010 |
| WO | WO-2007/105647 | 9/2007 |
| WO | WO-2009/112961 | 9/2009 |
| WO | WO-2009/115976 | 9/2009 |

* cited by examiner

LIGHT PROJECTION UNIT AND LIGHT PROJECTION DEVICE

This application is based on Japanese Patent Application No. 2011-101973 filed in Japan on Apr. 28, 2011 and on Japanese Patent Application No. 2012-013321 filed in Japan on Jan. 25, 2012, the contents of which are hereby incorporated by reference.

BACKGROUND OF THE INVENTION

1. Field of the Invention

The present invention relates to a light projection unit and a light projection device, and more particularly to a light projection unit and a light projection device that include a fluorescent member to which laser light is applied.

2. Description of the Related Art

Conventionally, light projection devices are known that include a fluorescent member to which laser light is applied (for example, see WO 2007/105647).

In WO 2007/105647 (pages 11 and 12 and FIG. 3) mentioned above, a light emission device (light projection device) is disclosed that includes a laser diode (laser generator), a light collection lens which is formed with a biconvex lens for collecting laser light emitted from the laser diode and a fluorescent member to which the laser light from the light collection lens is applied. In this light emission device, the laser light emitted from the laser diode is collected by the light collection lens and is applied to the fluorescent member. Then, the laser light is converted in wavelength by the fluorescent member into fluorescent light, and the fluorescent light is emitted to the outside.

However, the inventor of the present application has fully examined the light emission device of WO 2007/105647, and thereby has found the following problems. Specifically, as shown in FIG. 38, when the laser light is applied to the fluorescent member 1003 through the light collection lens 1002, a portion of the application surface 1003a of the fluorescent member 1003 (for example, a light collection point P1001) appears where the light density of the laser light is excessively increased. When the light density is excessively increased on the application surface 1003a of the fluorescent member 1003, it is likely that a fluorescent body and a binder contained in the fluorescent member 1003 are degraded by heat or are degraded by undergoing a chemical reaction caused by light.

One way to reduce the production of the portion of the application surface 1003a of the fluorescent member 1003 where the light density is excessively increased is to displace, as shown in FIG. 39, the application surface 1003a of the fluorescent member 1003 from the light collection point P1001 (see FIG. 38) of the laser light. However, as shown in FIG. 40, the light intensity distribution of the laser light is not uniform but is formed in the shape of Gaussian distribution. Hence, it has been found that, even when the application surface 1003a is displaced from the light collection point P1001 of the laser light, the portion of the application surface 1003a where the light density is excessively increased may be produced.

When vibration, aged deterioration or the like causes the displacement of the laser diode 1001, the light collection lens 1002 or the fluorescent member 1003, the light density on the application surface 1003a of the fluorescent member 1003 is greatly changed. Hence, it has been found that the portion where the light density is excessively increased is produced depending on the direction of the displacement.

SUMMARY OF THE INVENTION

The present invention is made in view of the foregoing problems; an object of the present invention is to provide a light projection unit and a light projection device that can reduce the production of a portion where the light density is excessively increased on a fluorescent member.

To achieve the above object, according to the present invention, there is provided a light projection unit that projects light in a predetermined direction, the light projection unit including: a light collection member that includes: a light entrance surface which laser light enters; and a light emission surface which has an area smaller than the area of the light entrance surface and from which the laser light is emitted; a fluorescent member that includes an application surface to which the laser light emitted from the light collection member is applied, that converts at least a part of the laser light into fluorescent light and that mainly emits the fluorescent light from the application surface; and a light projection member that projects the fluorescent light emitted from the fluorescent member, in which the light collection member has a function of changing, therewithin, the direction of travel of the laser light entering the light entrance surface and of guiding the laser light to the light emission surface, and the light emission surface of the light collection member is arranged a predetermined distance away from the application surface of the fluorescent member.

The phrase "mainly emits the fluorescent light from the application surface" means a case where about 90% or more of the fluorescent light emitted from the fluorescent member is emitted from the application surface, and includes a case where the laser light is converted into the fluorescent light in the vicinity of the application surface and the fluorescent light is emitted from the application surface and a case where the back surface (the surface on the side opposite to the application surface) of the fluorescent member is directly attached to the reflective surface and no fluorescent light is practically emitted from the back surface.

In the light projection unit of the present invention, as described above, the light collection member is provided that includes: the light entrance surface which the laser light enters; and the light emission surface which has an area smaller than the area of the light entrance surface and from which the laser light is emitted, and the light collection member has the function of changing, therewithin, the direction of travel of the laser light entering the light entrance surface and of guiding the laser light to the light emission surface. In this way, the laser light entering the light entrance surface travels within the light collection member while the direction of the travel is being changed, and is emitted from the light emission surface with the uniform light intensity distribution.

Since the light emission surface of the light collection member has an area smaller than that of the light entrance surface, the laser light that has been collected is emitted from the light emission surface.

The light emission surface of the light collection member is arranged the predetermined distance away from the application surface of the fluorescent member, and thus it is possible to reduce the entrance (return) of the light emitted from the application surface of the fluorescent member into the light emission surface of the light collection member.

Preferably, in the light projection unit, the light projection member includes a reflective member that has a first reflective surface which reflects the fluorescent light emitted from the fluorescent member. With this configuration, it is possible to reflect most of the light (fluorescent light) emitted from the fluorescent member off the reflective member. In other words, most of the light emitted from the fluorescent member can be controlled by the reflective member. Thus, it is possible to effectively illuminate a desired region.

Preferably, in the light projection unit, the light collection member further includes a second reflective surface which reflects the laser light entering the light entrance surface and which guides it to the light emission surface. With this configuration, it is possible to easily change, within the light collection member, the direction of travel of the laser light entering the light entrance surface and to guide the laser light to the light emission surface. Thus, it is possible to easily emit the laser light from the light emission surface with the uniform light intensity distribution.

Preferably, in the light projection unit, the light collection member is inclined with respect to the normal to the application surface of the fluorescent member. Since the light intensity of the light emitted from the fluorescent member in the direction of the normal to the application surface is highest, the light collection member is inclined with respect to the normal to the application surface of the fluorescent member, and thus it is possible to more reduce the entrance of the light emitted from the application surface of the fluorescent member into the light emission surface of the light collection member. In this way, it is possible to reduce the decrease in the efficiency of utilization of the light.

Preferably, in this case, the light collection member is inclined toward the side opposite to the predetermined direction with respect to the normal to the application surface of the fluorescent member. In this configuration, when the light projection member includes, for example, the reflective member, it is possible to reduce the entrance of the light reflected off the reflective member and travelling in the predetermined direction into the light collection member. In other words, it is possible to reduce the arrangement of the light collection member on the optical path of the light reflected off the reflective member. Thus, it is possible to more reduce the decrease in the efficiency of utilization of the light.

Preferably, in the light projection unit in which the light collection member is inclined with respect to the normal to the application surface of the fluorescent member, the light collection member is inclined at an angle that is equal to or more than 10 degrees but equal to or less than 30 degrees with respect to the normal to the application surface of the fluorescent member.

Preferably, in the light projection unit, the application surface of the fluorescent member is inclined toward the side opposite to the light projection direction with respect to the predetermined direction. In this configuration, when the light projection member includes, for example, the reflective member, it is possible to reduce the direct emission of the light emitted from the fluorescent member to the outside without the light passing through the reflective member. In other words, it is possible to reduce the amount of light that is not controlled by the reflective member. In this way, it is possible to reduce the decrease in the amount of light that reaches the desired region.

Preferably, in this case, an attachment member including the attachment surface to which the fluorescent member is attached is further included, and the attachment surface is inclined toward the side opposite to the light projection direction with respect to the predetermined direction. In this configuration, for example, it is possible to easily incline the application surface of the fluorescent member with respect to the predetermined direction toward the side opposite to the light projection direction even if the thickness of the fluorescent member is uniform. Since the fluorescent member may be formed such that their thickness becomes uniform, it is possible to easily manufacture the fluorescent member.

Preferably, in the light projection unit in which the application surface of the fluorescent member is inclined with respect to the predetermined direction toward the side opposite to the light projection direction, the application surface of the fluorescent member is inclined at an angle that is more than 0 degrees but equal to or less than 30 degrees with respect to the predetermined direction.

Preferably, in the light projection unit, the fluorescent member contains a fluorescent body, and a volume occupation rate of the fluorescent body in the fluorescent member is 90% or more. In this configuration, even if the thickness of the fluorescent member is small, it is possible to reduce the transmission of the laser light by the fluorescent member and to effectively convert the laser light into fluorescent light. The laser light applied to the fluorescent member is more likely to be converted into fluorescent light in the vicinity of the application surface of the fluorescent member. Thus, it is possible to easily and mainly emit the fluorescent light from the application surface of the fluorescent member.

Preferably, in the light projection unit, the light intensity distribution of the fluorescent light emitted from the fluorescent member is Lambertian distribution. In this configuration, the light intensity of the light emitted from the fluorescent member in the direction of the normal to the application surface is great, and the light intensity in a direction parallel to the application surface becomes substantially zero. Thus, it is possible to reduce the direct emission of the light emitted from the fluorescent member to the outside without the light passing through the reflective member. In other words, it is possible to reduce the amount of light that is not controlled by the light projection member. In this way, it is possible to reduce the decrease in the amount of light that reaches the desired region.

Preferably, in the light projection unit in which the light intensity distribution of the fluorescent light emitted from the fluorescent member is Lambertian distribution, the thickness of the fluorescent member is one-tenth or less of an overall dimension of the application surface. With this configuration, it is possible to easily make the light intensity distribution of the fluorescent light emitted from the fluorescent member Lambertian distribution.

The "overall dimension" means, for example, the diameter of a circle, the length of a major axis of or the length of a minor axis of an ellipse or the length of the long side of or the length of the short side of a rectangle.

Preferably, in the light projection unit in which the light intensity distribution of the fluorescent light emitted from the fluorescent member is Lambertian distribution, the application surface of the fluorescent member is sufficiently larger than the spot region of the laser light applied to the application surface. With this configuration, it is possible to easily make the light intensity distribution of the fluorescent light emitted from the fluorescent member Lambertian distribution.

Preferably, in the light projection unit, a metallic attachment member to which the fluorescent member is attached is further included. In this configuration, since it is possible to effectively dissipate the heat produced by the fluorescent member, the increase in the temperature of the fluorescent member can be reduced. Thus, it is possible to reduce the degradation of the fluorescent member by the heat and the decrease in the efficiency of light emission by the fluorescent member.

Preferably, in the light projection unit, the fluorescent member includes an application region to which the laser light is applied, and the application region is asymmetrical in a direction that intersects the predetermined direction. With this configuration, it is possible to easily form the light projection pattern of the light emitted from the light projection unit in the shape which is asymmetrical in the direction that intersects the predetermined direction.

Preferably, in the light projection unit, the fluorescent member includes an application region to which the laser light is applied, and the focus point of the light projection member is arranged in an edge portion of the application region. With this configuration, it is possible to rapidly switch light and dark areas in a portion of the light projection pattern of the light emitted from the light projection unit that corresponds to the edge portion of the application region where the focus point of the light projection member is arranged.

Preferably, in the light projection unit in which the focus point of the light projection member is arranged in the edge portion of the application region, the light projection unit is used as a headlight for an automobile, and the focus point of the light projection member is arranged in the edge portion of the application region on which a cut-off line of a light projection pattern is projected. With this configuration, it is possible to rapidly switch light and dark areas in the cut-off line, which is particularly effective.

In the present specification and the scope of claims, the cut-off line refers to a division line of the light and dark areas of the light projection pattern of a low beam (passing headlight). The light and dark areas are required to be rapidly switched in the cut-off line.

Preferably, in the light projection unit that is used as the headlight for the automobile, the focus point of the light projection member is arranged in a position of the application region on which an elbow point of the light projection pattern is projected. With this configuration, it is possible to rapidly switch light and dark areas in the vicinity of the elbow point, which is more effective. It is also possible to most brighten the vicinity of the elbow point. In other words, it is possible to most brighten the region directly in front of the automobile.

In the present specification and the scope of claims, the elbow point refers to the intersection point of the cut-off lines of the left and right halves of the low beam (passing headlight).

Preferably, in the light projection unit, the light emission surface is asymmetrical in a direction that intersects the predetermined direction. With this configuration, since it is possible to form the application region of the fluorescent member in the shape which is asymmetrical in the direction that intersects the predetermined direction, it is possible to easily form the light projection pattern of the light emitted from the light projection unit in the shape which is asymmetrical in the direction that intersects the predetermined direction.

Preferably, in the light projection unit in which the light emission surface is asymmetrical in the direction that intersects the predetermined direction, the light projection unit is used as a headlight for an automobile, and the light emission surface is formed in a shape corresponding to a light projection pattern of a passing headlight. With this configuration, it is possible to easily realize the light projection pattern necessary for the passing headlight.

Preferably, in the light projection unit in which the light projection member includes the reflective member, the first reflective surface is formed to include at least a part of any one of a paraboloidal surface and an elliptical surface. With this configuration, it is possible to easily convert the light (illumination light) emitted from the light projection unit into parallel light or collect the light by arranging the fluorescent member in the focus point of the first reflective surface.

Preferably, in this case, the first reflective surface is formed in a shape obtained by diving any one of the paraboloidal surface and the elliptical surface both by a plane that intersects an axis connecting the focus point and the vertex thereof and by a plane that is parallel to an axis connecting the focus point and the vertex. With this configuration, it is possible to reduce the size of the reflective member and the light projection unit.

Preferably, in the light projection unit in which the first reflective surface is formed to include at least a part of any one of the paraboloidal surface and the elliptical surface, the light projection member includes a reflective member and a lens that transmits the fluorescent light, the first reflective surface is formed to include the part of the elliptical surface, the fluorescent member includes an application region to which the laser light is applied, the first focus point of the first reflective surface is arranged in the application region and the second focus point of the first reflective surface coincides with the focus point of the lens. In this configuration, the light emitted from the application region is reflected off the first reflective surface, passes through the second focus point of the first reflective surface and is projected onto the lens. Here, since the second focus point of the first reflective surface coincides with the focus point of the lens, the shape of the application region is easily reflected on the light projection pattern formed by the lens. When the light is projected using the lens, as compared with a case where the light is projected by the reflective member without the provision of the lens, the shape of the application region is more easily reflected on the light projection pattern. The reflective member is provided, and thus it is possible to utilize, as compared with the case where the reflective member is not provided, a larger amount of light emitted from the fluorescent member as the illumination light. In this way, it is possible to enhance the efficiency of utilization of the light.

In the present specification and the scope of claims, the first focus point refers to a focus point that is closer to the vertex of the first reflective surface, and the second focus point refers to a focus point that is farther away from the vertex of the first reflective surface.

Preferably, in the light projection unit, the light projection member includes a lens that transmits the fluorescent light emitted from the fluorescent member, the fluorescent member includes an application region to which the laser light is applied and the focus point of the lens is arranged in the application region. In this configuration, the shape of the application region is easily reflected on the light projection pattern formed by the lens. When the light is projected using the lens, as compared with the case where the light is projected by the reflective member without the provision of the lens, the shape of the application region is more easily reflected on the light projection pattern.

Preferably, in the light projection unit, the corners of a cross section perpendicular to the direction in which the light is guided by the light collection member are chamfered. In this configuration, since it is possible to reduce the dispersion of the laser light on the corners of the light collection member, it is possible to reduce the leakage of the laser light from the light collection member. Thus it is possible to enhance the efficiency of utilization of the laser light.

Preferably, in the light projection unit, laser light emitted from a plurality of laser generators enters the light entrance surface of the light collection member. With this light collection member, it is possible to easily collect the laser light emitted from a plurality of laser generates. Hence, when a plurality of laser generators are used as the light source, the use of the light collection member described above is particularly effective.

Preferably, in the light projection unit, the light emission surface of the light collection member is arranged a distance that is equal to or more than 0.3 mm but equal to or less than 1.1 mm away from the application surface of the fluorescent member.

The light projection device of the present invention includes the light projection unit configured as described above and a laser generator that emits laser light to the light collection member of the light projection unit.

DETAILED DESCRIPTION OF THE PREFERRED EMBODIMENTS

Embodiments of the present invention will be described below with reference to accompanying drawings. For ease of understanding, no hatching may be performed even in a cross-sectional view, and hatching may be performed even in a diagram other than a cross-sectional view.

(First Embodiment)

The structure of a light projection device 1 according to a first embodiment of the present invention will first be described with reference to FIGS. 1 to 24. For ease of illustration, a reduced number of semiconductor laser elements 11 may be shown.

Figure 1:
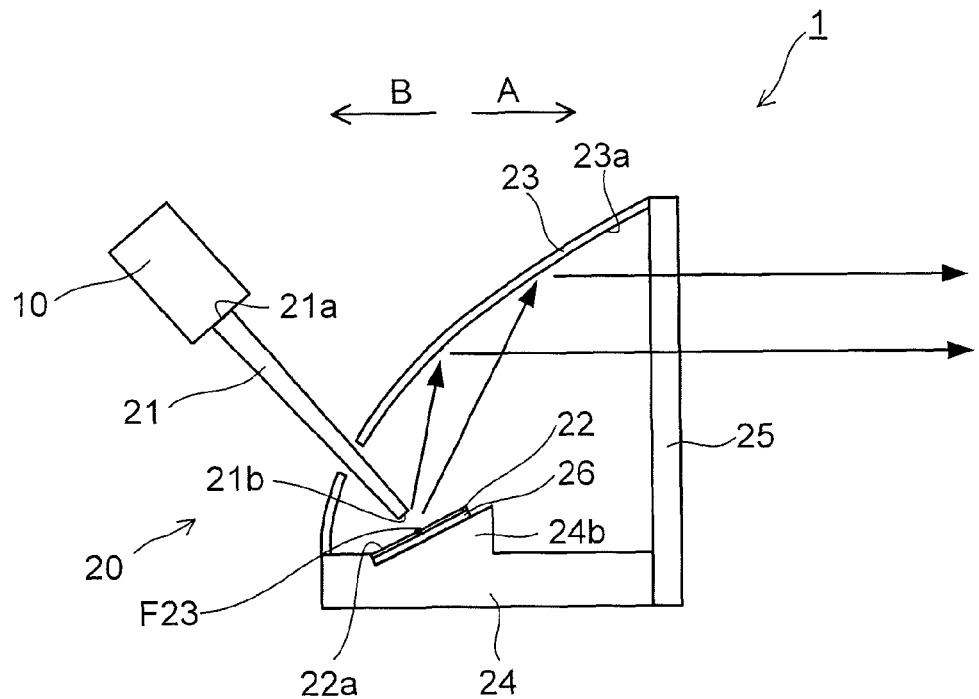
FIG. 1 is a cross-sectional view showing the structure of a light projection device including a light projection unit according to a first embodiment of the present invention.
Figure 2:
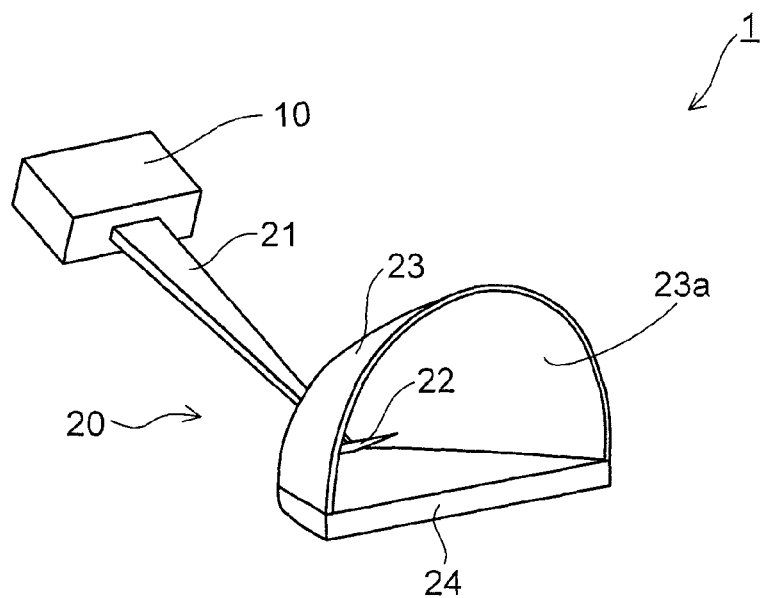
FIG. 2 is a perspective view showing the structure of the light projection unit according to the first embodiment of the present invention.

The light projection device 1 according to the first embodiment of the present invention is a light projection device that is used as, for example, a headlight which illuminates an area ahead of an automobile or the like. As shown in FIGS. 1 and 2, the light projection device 1 includes a laser generation device 10 that functions as a laser light source (excitation light source) and a light projection unit 20 that utilizes laser light emitted from the laser generation device 10 and thereby projects the light in a predetermined direction (A direction). In FIG. 2, for ease of understanding, an attachment portion 24b, a filter member 25 and a support plate 26 of the light projection unit 20, which will be described later, are not shown.

Figure 3:
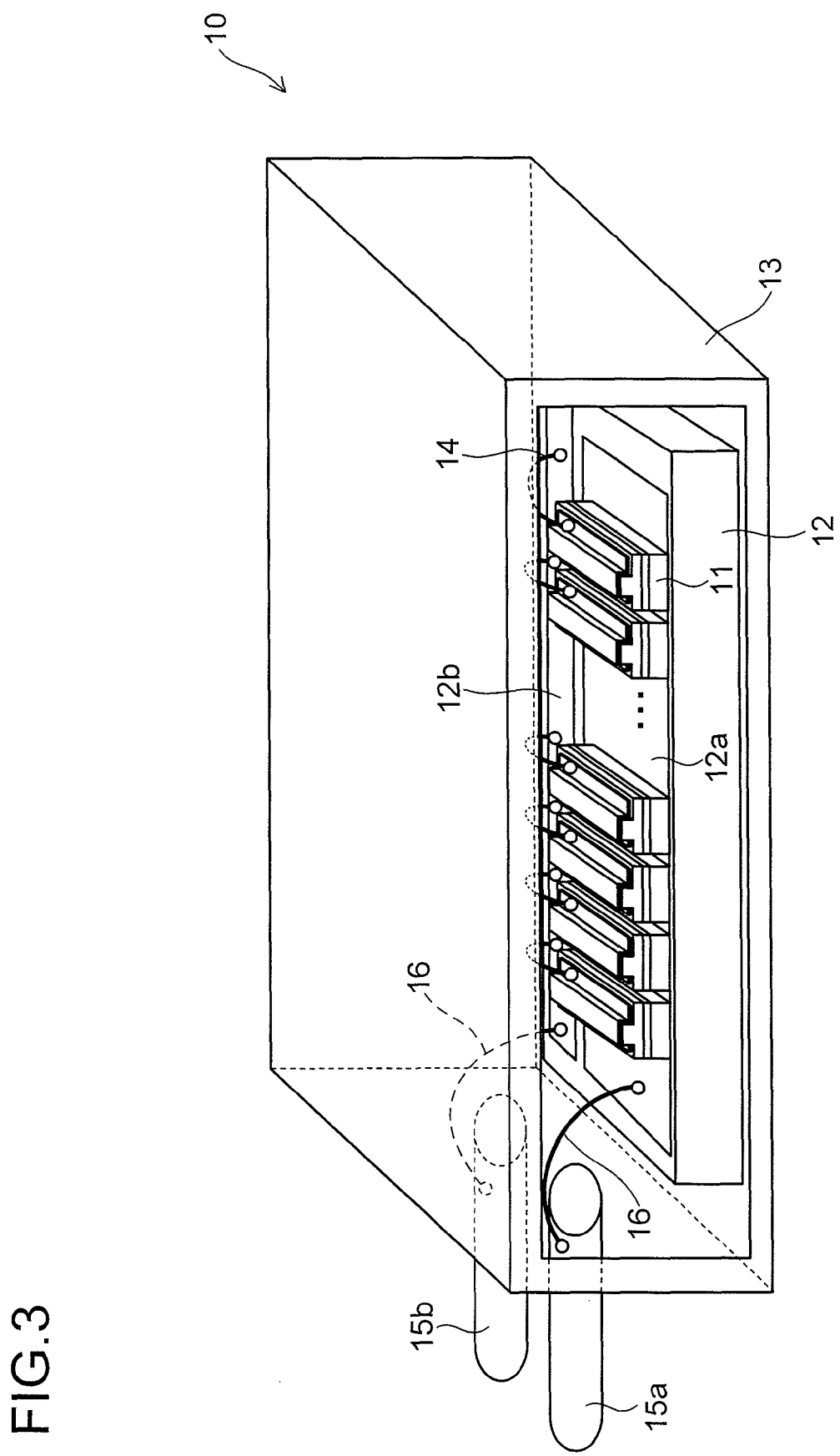
FIG. 3 is a perspective view showing the structure of a laser generation device according to the first embodiment of the present invention.

As shown in FIG. 3, the laser generation device 10 includes a plurality of semiconductor laser elements 11 (laser generators), a heat spreader 12 on which the semiconductor laser elements 11 are mounted and a metallic holding member 13 that holds these components.

Figure 4:
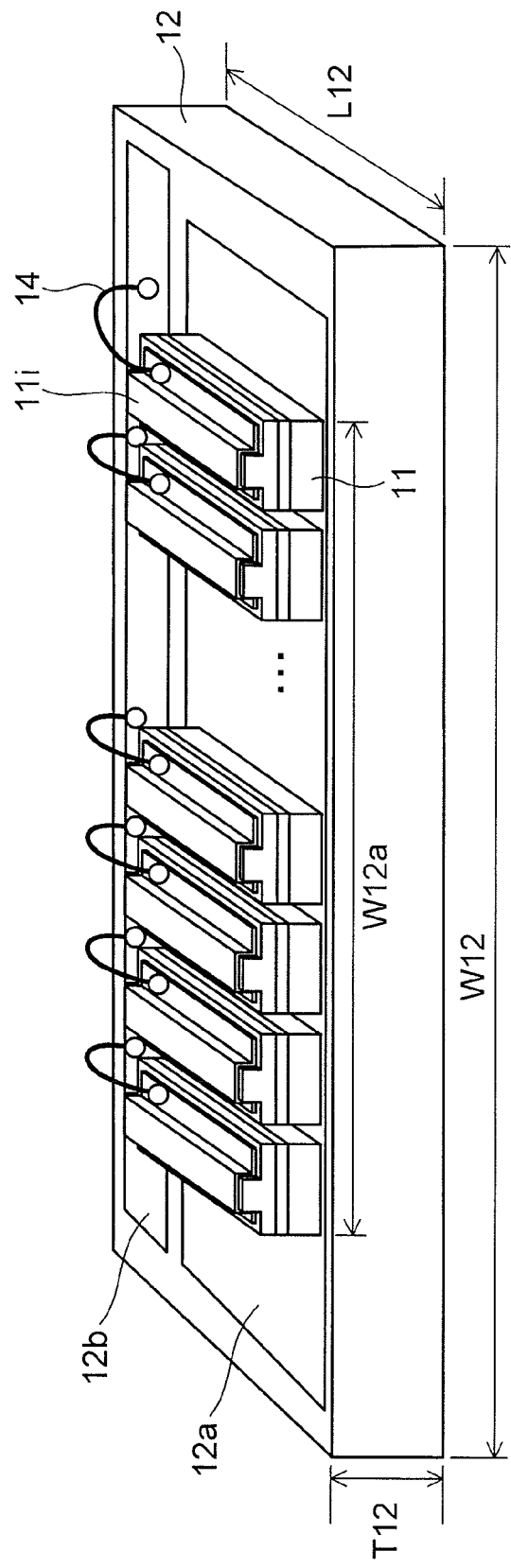
FIG. 4 is a perspective view showing the structures of semiconductor laser elements and a heat spreader according to the first embodiment of the present invention.

The heat spreader 12 is formed with, for example, a flat plate made of aluminum nitride, and is soldered to the bottom surface of the holding member 13. As shown in FIG. 4, the heat spreader 12 has, for example, a width (W12) of about 15 mm, a thickness (T12) of about 1 mm and a depth (L12) of about 2 mm. On the mounting surface of the heat spreader 12, long slender electrode patterns 12a and 12b are formed. On the electrode pattern 12a, a plurality of semiconductor laser elements 11 are aligned linearly and mounted. In the present embodiment, for example, 13 semiconductor laser elements 11 are mounted and arranged along the width (W12a) of about 10 mm. The width (W12a) is preferably less than the width (W21a) (see FIG. 9) of the light entrance surface 21a of a light collection member 21, which will be described later, of the light projection unit 20.

Figure 5:
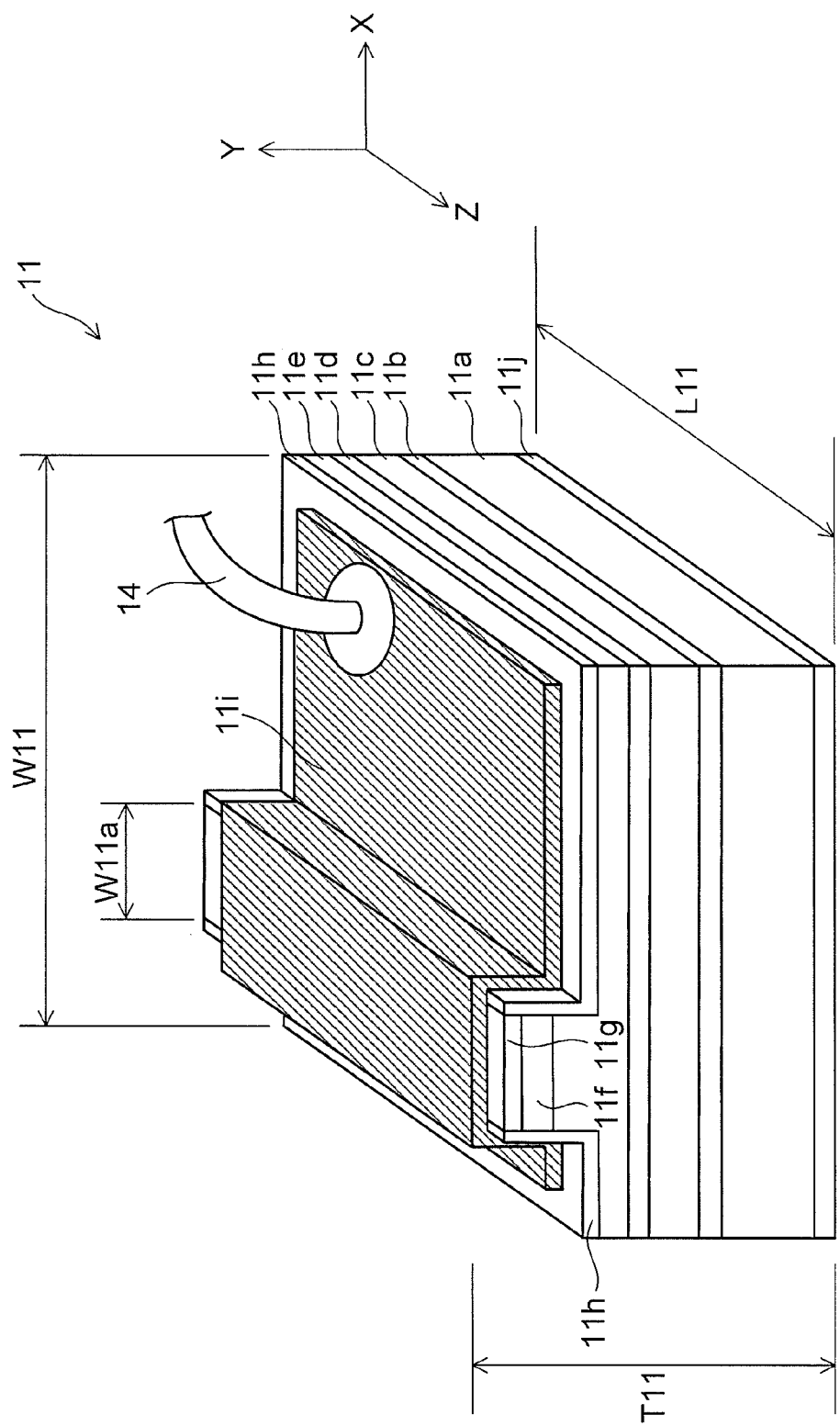
FIG. 5 is a perspective view showing the structure of the semiconductor laser element according to the first embodiment of the present invention.

The semiconductor laser element 11 is, for example, a board area type laser, and emits laser light that functions as excitation light. The semiconductor laser element 11 is configured to emit blue-violet laser light having a center wavelength of, for example, about 405 nm. As shown in FIG. 5, the semiconductor laser element 11 has, for example, a width (W11) of about 200 µm, a thickness (T11) of about 100 µm and a length (L11) of about 1000 µm.

The semiconductor laser element 11 includes a substrate 11a that is formed of n-type GaN and that has a thickness of about 100 µm and the following layers that are formed on the substrate 11a in this order: a buffer layer 11b which has a thickness of about 0.5 µm and which is formed of n-type GaN, a lower clad layer 11c which has a thickness of about 2 µm and which is formed of n-type $Al_{0.05}Ga_{0.95}N$, an active layer 11d which is formed of a InGaN multiple quantum well and an upper clad layer 11e which has a thickness of about 0.5 µm (at the thickest portion) and which is formed of p-type $Al_{0.05}Ga_{0.95}N$.

In predetermined position of the upper clad layer 11e, a ridge that extends in a Z direction (the length direction of the semiconductor laser element 11) is formed. On the ridge, a contact layer 11f that has a thickness of about 0.1 µm and that is formed of p-type GaN and an electrode 11g that is formed of Pd are formed. An insulation film 11h formed of $SiO_2$ is formed so as to cover the upper surface of the upper clad layer 11e and the side surfaces of the contact layer 11f and the electrode 11g. On a predetermined region on the insulation film 11h, a pad electrode 11i is formed that covers the ridge and that is in ohmic contact with the electrode 11g. On the lower surface of the substrate 11a, a rear surface electrode 11j formed of Hf/Al is formed.

As shown in FIG. 4, the pad electrode 11i of each of the semiconductor laser elements 11 is electrically connected through an Au wire 14 to the electrode pattern 12b of the heat spreader 12. The rear surface electrode 11j (see FIG. 5) of each of the semiconductor laser elements 11 is electrically connected through an unillustrated solder layer or the like to the electrode pattern 12a. The width of a light emission portion 11k (see FIG. 7) of the semiconductor laser element 11 is specified by the ridge width (W11a of FIG. 5) of the upper clad layer 11e; the ridge width is set at, for example, 7 µm. In this case, the width of the light emission portion 11k is about 7 µm.

Figure 6:
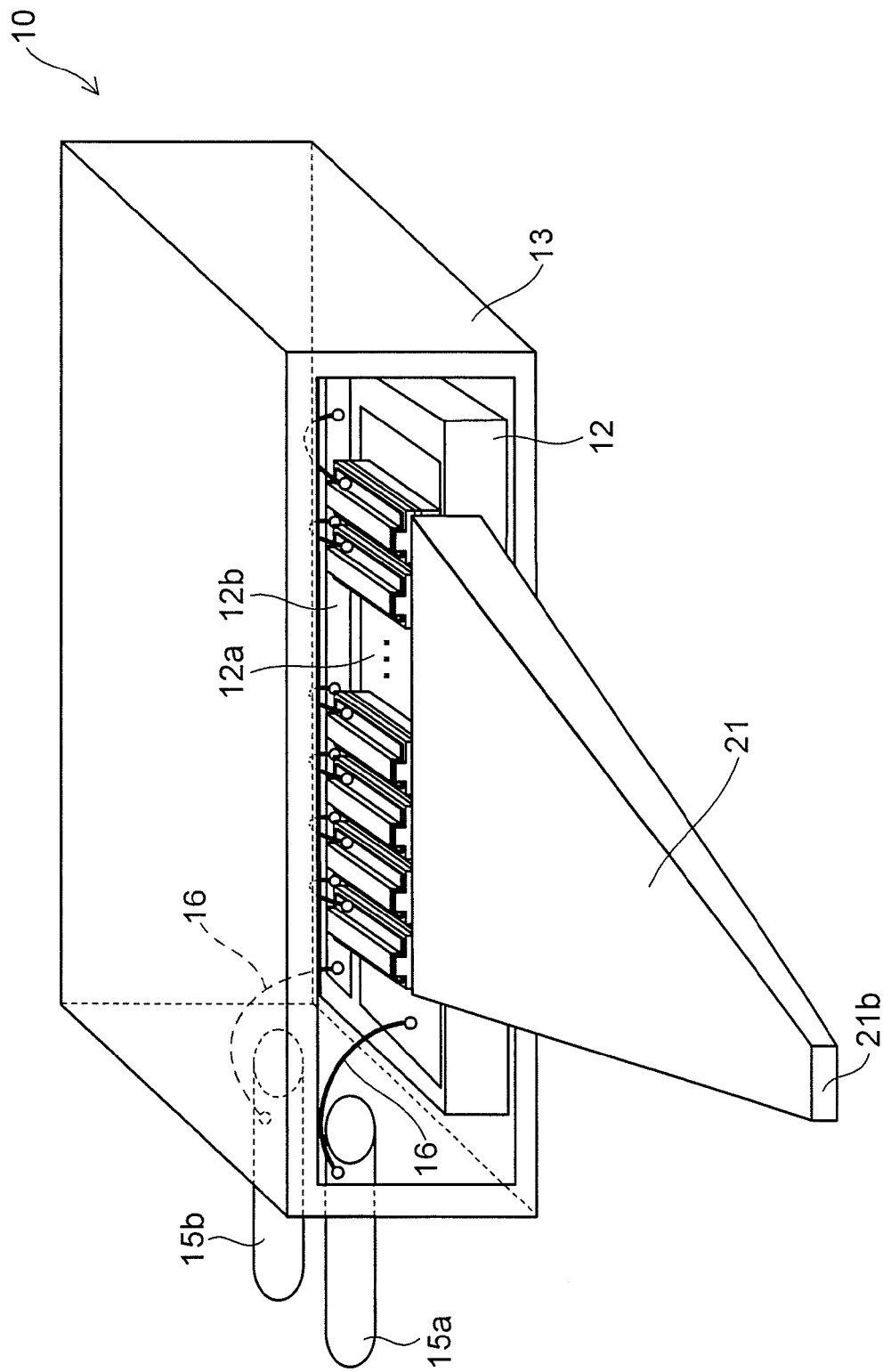
FIG. 6 is a perspective view showing a state where a light collection member is attached to the laser generation device according to the first embodiment of the present invention.

As shown in FIG. 3, the holding member 13 is formed in the shape of a box so as to have an opening portion on the emission side of the laser light. Electrode pins 15a and 15b for feeding electric power to the semiconductor laser elements 11 are inserted into the holding member 13. The electrode pins 15a and 15b are electrically connected, with metal wires 16, to the electrode patterns 12a and 12b, respectively, of the heat spreader 12. An unillustrated glass plate is attached to the opening portion of the holding member 13; an inert gas is sealed into the holding member 13. A radiating fin or the like (not shown) may be provided in the holding member 13; for example, the holding member 13 may be cooled. As shown in FIG. 6, the light collection member 21, which will be described later, of the light projection unit 20 is fixed through a transparent adhesive layer to a predetermined position of the glass plate. Thus, the laser light emitted from a plurality of semiconductor laser elements 11 enters the light collection member 21.

Figure 7:
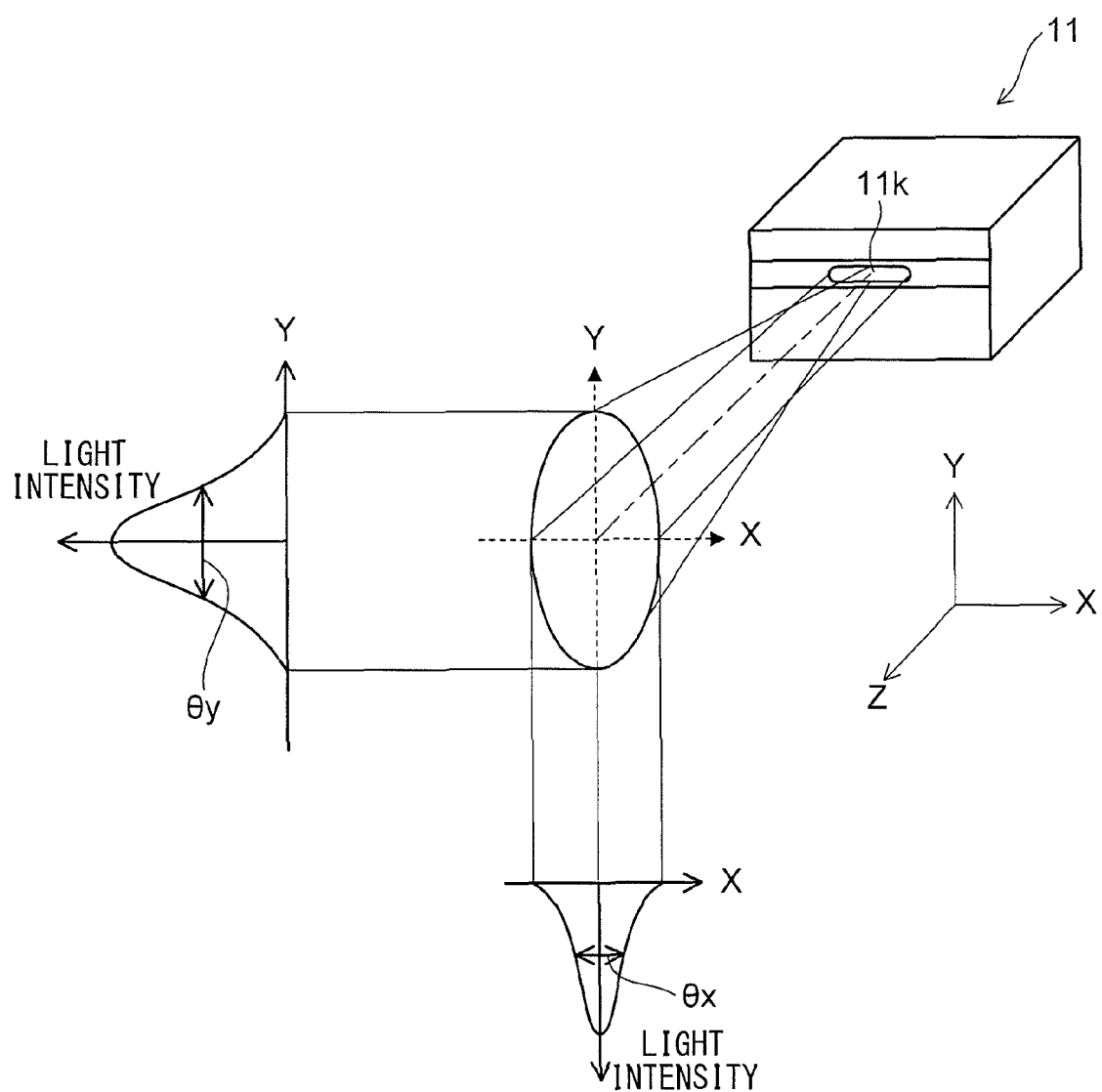
FIG. 7 is a diagram illustrating laser light emitted from the semiconductor laser elements according to the first embodiment of the present invention.

When a direct current is applied between the pad electrode 11i and the rear surface electrode 11j of the semiconductor laser element 11, as shown in FIG. 7, laser light that extends, both in an X direction (the width direction of the semiconductor laser element 11) and a Y direction (the thickness direction of the semiconductor laser element 11), into an elliptical shape, is emitted from the light emission portion 11k. The light intensity distribution of the elliptical light that is projected on an XY plane perpendicular to the direction of travel of the laser light (Z direction) is Gaussian distribution both in the X direction and in the Y direction. The full width at half maximum (θx) of the light intensity distribution in the X direction is about 10°; the full width at half maximum (θy)

in the Y direction is about 20°; the spread angle of the laser light is about twice as great in the Y direction as in the X direction. Hence, the laser light travels, while spreading, with the X direction being the direction of a short axis and the Y direction being the direction of a long axis.

When an electric power of about 57 W is fed to the laser generation device 10, the output of the laser generation device 10 is about 9.4 W. Here, the illuminance of the maximum illuminance point 25 m in front of the light projection device 1 is about 150 lux (lx); the luminous flux of laser light emitted through a reflective member 23 describe later to the outside is about 533 lumens (lm).

As shown in FIG. 1, the light projection unit 20 is arranged on the laser light emission side of the laser generation device 10 (the semiconductor laser elements 11). The light projection unit 20 includes: the light collection member 21 that collects and guides the laser light from the laser generation device 10; a fluorescent member 22 that converts at least part of the laser light emitted from the light collection member 21 into fluorescent light and that emits the fluorescent light; the reflective member 23 (light projection member) that reflects the fluorescent light emitted from the fluorescent member 22 in a predetermined direction (A direction); an attachment member 24 to which the fluorescent member 22 is fixed; and the filter member 25 that is provided in the opening portion of the reflective member 23.

Figure 8:
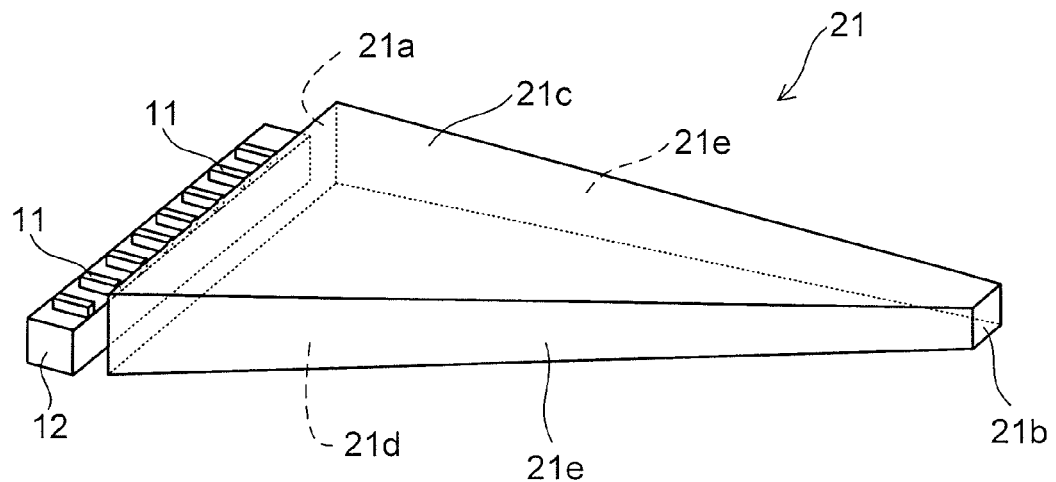
FIG. 8 is a perspective view illustrating the structure of the light collection member according to the first embodiment of the present invention.

The light collection member 21 is formed with a transparent member. Examples of the material of the light collection member 21 include, for example, glasses such as borosilicate crown optical glass (BK7) and synthetic quartz and a resin. As shown in FIG. 8, the light collection member 21 includes: the light entrance surface 21a which the laser light emitted from a plurality of semiconductor laser elements 11 enters; a light emission surface 21b through which the laser light is emitted; and an upper surface 21c, a lower surface 21d, and a pair of side surfaces 21e which are arranged between the light entrance surface 21a and the light emission surface 21b. The upper surface 21c, the lower surface 21d and the pair of side surfaces 21e are examples of a "second reflective surface" of the present invention.

Figure 9:
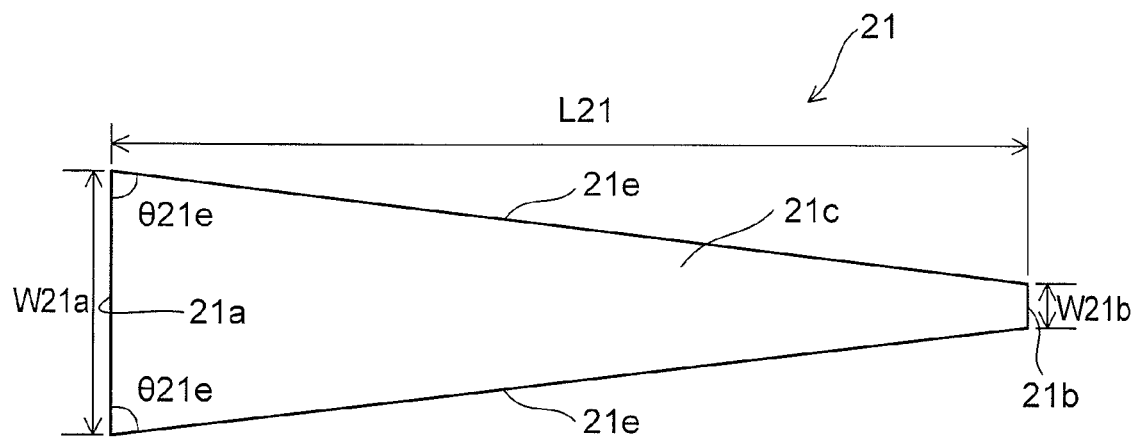
FIG. 9 is an upper view showing the structure of the light collection member according to the first embodiment of the present invention.
Figure 10:
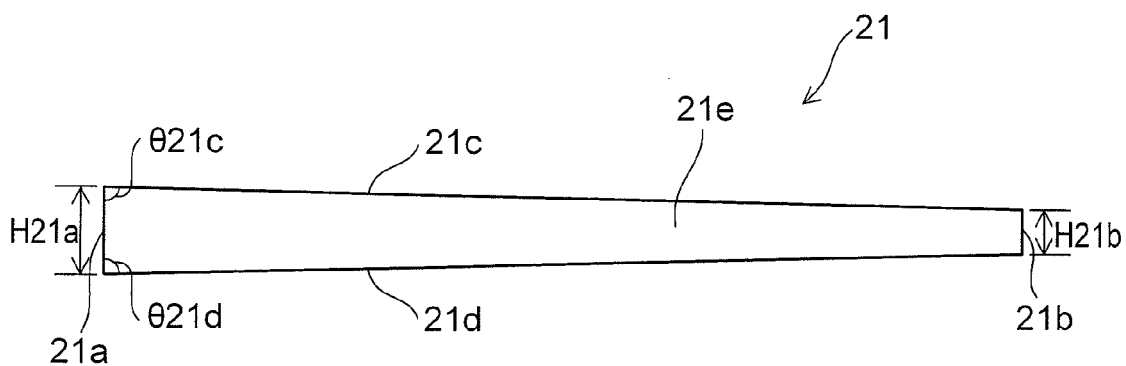
FIG. 10 is a side view showing the structure of the light collection member according to the first embodiment of the present invention.

The light entrance surface 21a is formed with, for example, a substantially rectangular flat surface. The light emission surface 21b is formed with, for example, a substantially square (rectangular) flat surface, and has an area smaller than that of the light entrance surface 21a. Specifically, as shown in FIGS. 9 and 10, the light entrance surface 21a has a height (H21a) of about 2.24 mm and a width (W21a) of about 11.0 mm. The light emission surface 21b has a height (H21b) of about 1.03 mm and a width (W21b) of about 1.03 mm. In other words, the light collection member 21 is tapered both in the width direction and the thickness direction. On the light entrance surface 21a and the light emission surface 21b, an unillustrated AR (anti reflection) film may be formed.

The light emission surface 21b may be formed to be a frosted glass-shaped rough surface or may be formed in a so-called moth-eye shape. In this case, the efficiency of extracting the laser light from the interior of the light collection member 21 through the light emission surface 21b to the outside was significantly enhanced. If the light emission surface 21b is a flat surface, when the laser light reaches the light emission surface 21b within the light collection member 21, the laser light is reflected off the inside of the light emission surface 21b, with the result that a laser light component which cannot be extracted to the outside is produced. By contrast, the light emission surface 21b is formed to be the frosted glass-shaped rough surface or is formed in the so-called moth-eye shape, and thus it is possible to efficiently extract the light to the outside as a result of the reflection off the inside of the light emission surface 21b being reduced.

The upper surface 21c and the lower surface 21d are formed in the same shape; the pair of side surfaces 21e are formed in the same shape. The upper surface 21c, the lower surface 21d and the pair of side surfaces 21e have a length (L21) of about 50 mm.

The angles ($θ21c$ and $θ21d$) of the upper surface 21c and the lower surface 21d with respect to the light entrance surface 21a are greater than the angle ($θ21e$) of the side surface 21e with respect to the light entrance surface 21a.

Figure 11:
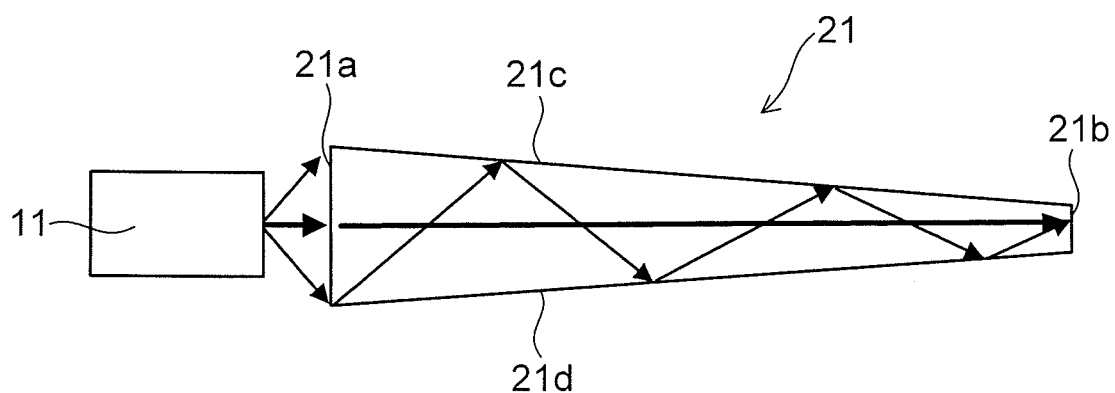
FIG. 11 is a side view illustrating the travel of the laser light entering the light collection member according to the first embodiment of the present invention.
Figure 12:
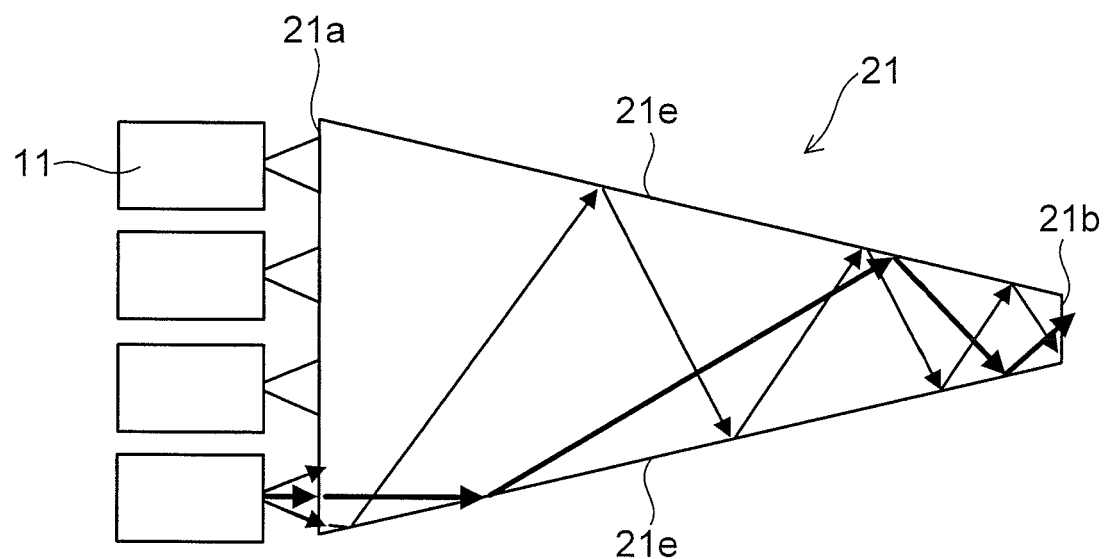
FIG. 12 is an upper view illustrating the travel of the laser light entering the light collection member according to the first embodiment of the present invention.

The travel of the laser light that has entered the light collection member 21 will now be described briefly. As shown in FIGS. 11 and 12, the laser light emitted from the semiconductor laser elements 11 travels, while spreading both in the direction of the long axis and in the direction of the short axis, and enters the light entrance surface 21a of the light collection member 21. Then, the laser light is repeatedly totally reflected off the upper surface 21c, the lower surface 21d and the pair of side surfaces 21e, and thus is guided, while being collected, to the light emission surface 21b and is emitted from the light emission surface 21b to the outside. In other words, the light collection member 21 has the function of changing, within the light collection member 21, the direction of travel of the laser light entering the light entrance surface 21a and of guiding the laser light to the light emission surface 21b. Since the spread angle of the laser light emitted from the semiconductor laser elements 11 in the direction of the long axis is greater than the spread angle in the direction of the short axis, total reflection conditions are unlikely to be satisfied by the upper surface 21c and the lower surface 21d. Hence, the angles ($θ21c$ and $θ21d$) (see FIG. 10) of the upper surface 21c and the lower surface 21d with respect to the light entrance surface 21a are made greater than the angle ($θ21e$) (see FIG. 9) of the side surface 21e with respect to the light entrance surface 21a, and thus the degree to which the total reflection conditions are not satisfied by the upper surface 21c and the lower surface 21d is reduced.

Figure 13:
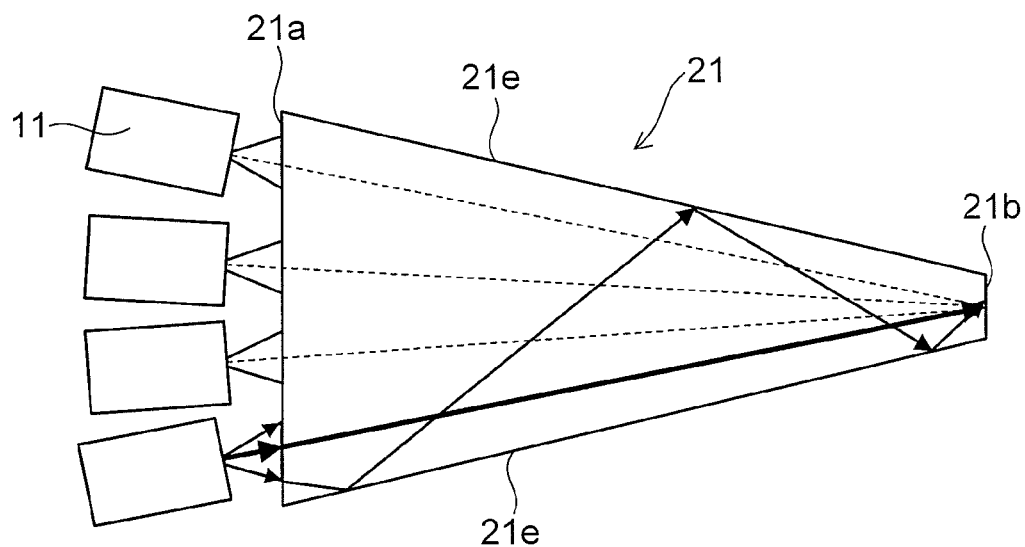
FIG. 13 is an upper view showing a variation of the direction of the arrangement of the semiconductor laser elements according to the first embodiment of the present invention.
Figure 14:
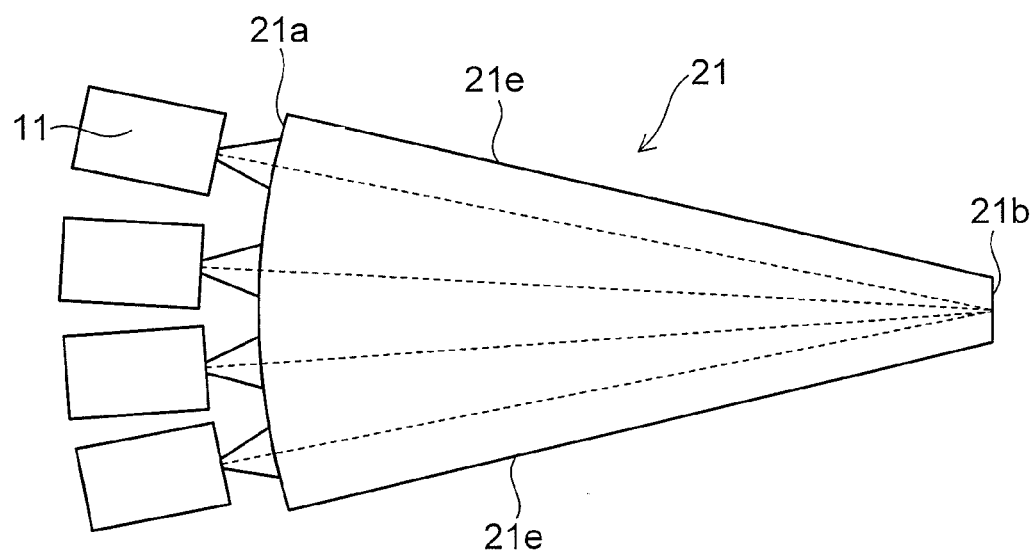
FIG. 14 is an upper view showing a variation of the light collection member according to the first embodiment of the present invention.

When, as shown in FIG. 13, the semiconductor laser elements 11 are arranged such that the direction of emission of the laser light (the direction of the optical axis of the laser light) faces the vicinity of the center of the light emission surface 21b of the light collection member 21, the total reflection conditions are more likely to be satisfied by the side surfaces 21e, which is particularly effective. When the semiconductor laser elements 11 are arranged such that the direction of emission of the laser light faces the vicinity of the center of the light emission surface 21b, as shown in FIG. 14, the light entrance surface 21a may be formed such that the direction of emission of the laser light is perpendicular to the light entrance surface 21a. Thus, it is possible to reduce the decrease in the efficiency of the entrance of the laser light into the light collection member 21.

Figure 15:
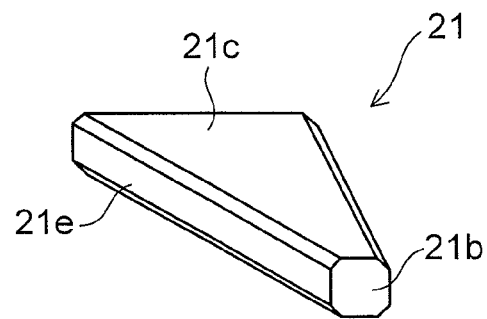
FIG. 15 is a perspective view showing a variation of the light collection member according to the first embodiment of the present invention.
Figure 16:
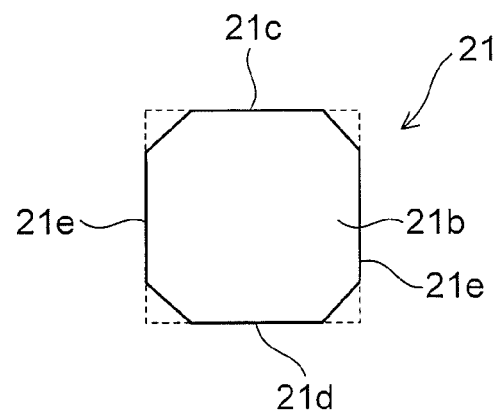
FIG. 16 is a front view showing the light emission surface of the light collection member of FIG. 15.
Figure 17:
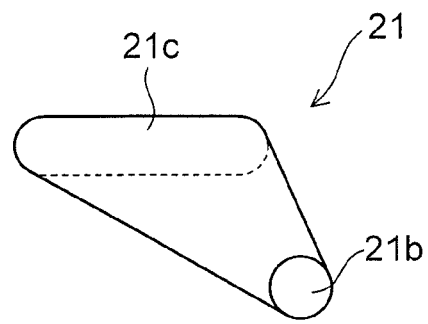
FIG. 17 is a perspective view showing a variation of the light collection member according to the first embodiment of the present invention.

As shown in FIGS. 15 to 17, the edges of the light collection member 21 may be chamfered. Specifically, the cross section perpendicular to the direction in which the light is guided by the light collection member 21 may be rectangular with the corners thereof chamfered. In this case, as shown in FIGS. 15 and 16, for example, the edges (the corners of the cross section) may be chamfered (C 0.3 mm). As shown in FIG. 17, the edges of the light collection member 21 may be rounded such that the light emission surface 21b is substantially circular. The direction in which the light is guided by the light collection member 21 is the direction in which the light collection member 21 extends from the center of the light entrance surface 21a to the center of the light emission surface 21b.

Figure 18:
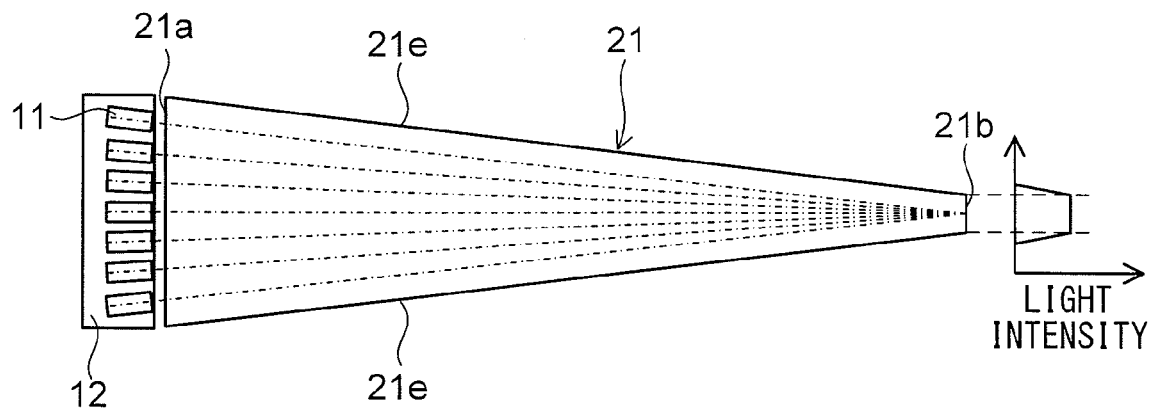
FIG. 18 is a diagram illustrating the light intensity distribution of the laser light on the light emission surface of the light collection member according to the first embodiment of the present invention.

As shown in FIG. 18, the light intensity distribution of the laser light on the light emission surface 21b of the light collection member 21 according to the present embodiment is uniform. In other words, the light intensity distribution of the laser light emitted from the light emission surface 21b is not Gaussian distribution.

Figure 19:
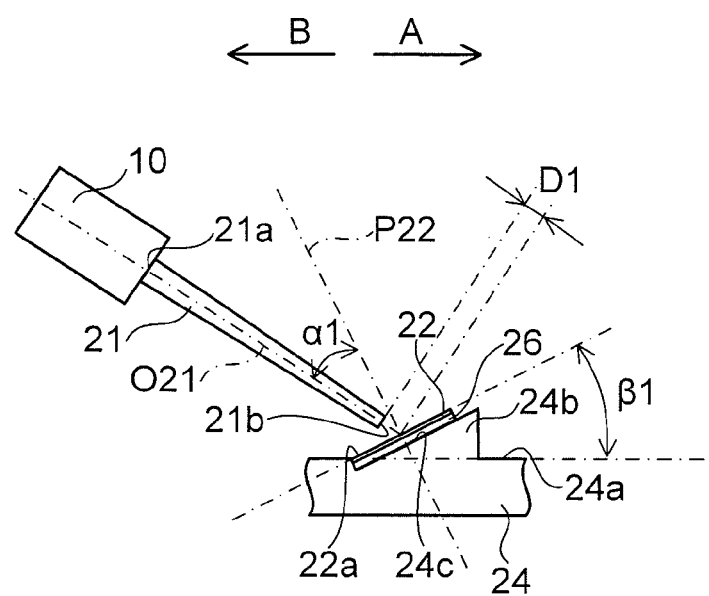
FIG. 19 is a diagram showing the structure of the perimeter of a fluorescent member according to the first embodiment of the present invention.

As shown in FIG. 19, the center axis O21 of the light collection member 21 is inclined at only an angel α1 (for example, 30 degrees) that is equal to or more than 10 degrees but equal to or less than 30 degrees with respect to a normal P22 to the application surface 22a, described later, of the fluorescent member 22 toward the B direction (the side opposite to the light projection direction (a predetermined direction, the A direction)). Between the light emission surface 21b of the light collection member 21 and the application surface 22a of the fluorescent member 22, a gap (space) is formed. Specifically, the light emission surface 21b of the light collection member 21 is arranged a distance D1 (a predetermined distance) that is equal to or more than about 0.3 mm but equal to or less than 1.1 mm away from the application surface 22a of the fluorescent member 22.

The center axis O21 of the light collection member 21 is an axis that passes through the center of the light entrance surface 21a and the center of the light emission surface 21b, and that is perpendicular to the light entrance surface 21a and the light emission surface 21b. The light projection direction refers to a direction in which the light travels to an area which is, for example, 25 m in front of the light projection device 1 and which is most desired to be illuminated, that is, for example, a direction in which the light travels to the maximum illuminance point 25 m in front of the center of the opening of a reflective surface 23a. In the present embodiment, the light projection direction refers to a direction which is parallel to an upper surface 24a, described later, of the attachment member 24 and which is perpendicular to the opening surface (the edge surface on the side of the A direction) of the reflective member 23.

Figure 20:
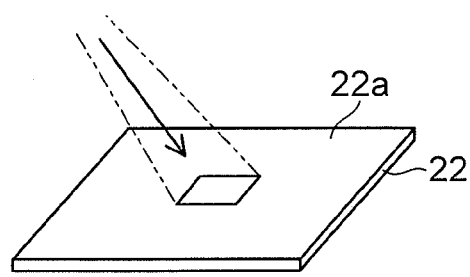
FIG. 20 is a perspective view showing a state where the laser light is applied to only a center portion of the fluorescent member according to the first embodiment of the present invention.
Figure 21:
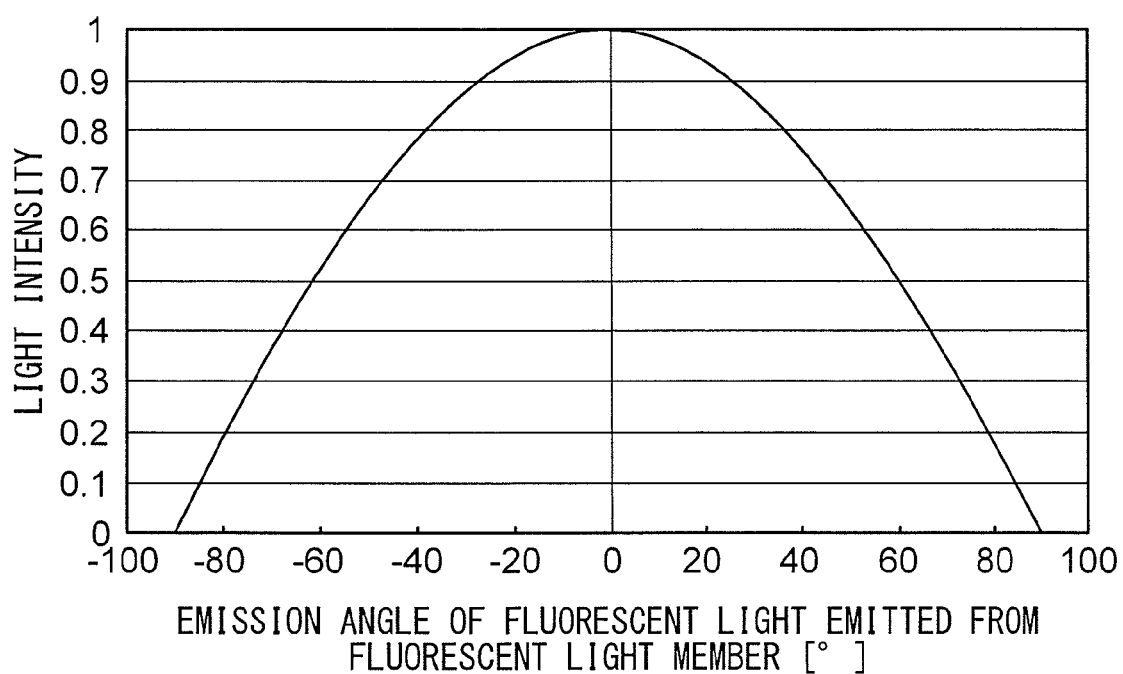
FIG. 21 is a diagram showing the light intensity distribution of fluorescent light emitted from the fluorescent member according to the first embodiment of the present invention.

The fluorescent member 22 has the application surface 22a to which the laser light is applied. The back surface (the surface on the side opposite to the application surface 22a) of the fluorescent member 22 is in contact with the support plate 26 formed of aluminum. The fluorescent member 22 is formed by being deposited on the support plate 26 by, for example, electrophoresis. The support plate 26 has a width (an overall dimension) of about 10 mm, a length (an overall dimension) of about 10 mm and a thickness of about 1 mm. The fluorescent member 22 has a width of about 10 mm, a length of about 10 mm and a uniform thickness of about 0.1 mm. As shown in FIG. 20, the laser light collected through the light collection member 21 is applied to the center portion of the application surface 22a of the fluorescent member 22. Here, since the light emission surface 21b of the light collection member 21 has a height (H21b) of about 1.03 mm and a width (W21b) of about 1.03 mm, the region which is the center portion of the application surface 22a and to which the laser light is applied is about 2 mm square, with the result that the area sufficiently smaller than the area of the fluorescent member 22 is excited by the laser light. Hence, the light intensity distribution of the fluorescent light emitted from the fluorescent member 22 is Lambertian distribution, as shown in FIG. 21.

Figure 22:
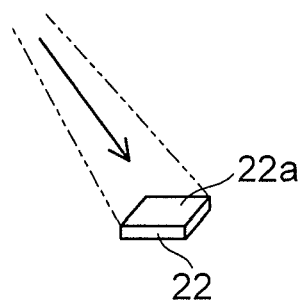
FIG. 22 is a diagram showing a state where the thickness of the fluorescent member according to the first embodiment of the present invention is formed to be one-tenth or less of the overall dimension of an application surface and the laser light is applied to the entire fluorescent member.

On the other hand, the fluorescent member 22 that has only an area corresponding to the area to which the laser light is applied can also be used. For example, the fluorescent member 22 that is configured as shown in FIG. 22 can be used. Here, the thickness of the fluorescent member 22 is set at one-tenth or less of the overall dimension (diameter) of the fluorescent member 22. When the thickness of the fluorescent member 22 is sufficiently smaller than the overall dimension, the amount of light emitted from the side surface is sufficiently smaller than the amount of fluorescent light emitted from the application surface 22a. Hence, the fluorescent light emitted from the fluorescent member 22 is mainly emitted from the application surface 22a, and the light intensity distribution of the fluorescent light emitted from the fluorescent member 22 is Lambertian distribution, as shown in FIG. 21. As described above, either the application surface 22a is formed to be sufficiently larger than the spot region of the laser light or the thickness of the fluorescent member 22 is formed to be one-tenth or less of the overall dimension of the application surface 22a, and thus the light intensity distribution of the fluorescent light emitted from the fluorescent member 22 can be easily Lambertian distribution, with the result that the light intensity distribution of the fluorescent light can be limited and that the efficiency of utilization of the fluorescent light can be enhanced.

The fluorescent member 22 is formed with three types of fluorescent body particles that convert, for example, blue-violet light (excitation light) into red light, green light and blue light and that emit them. An example of the fluorescent body that converts blue-violet light into red light is $CaAlSiN_3$:Eu. An example of the fluorescent body that converts blue-violet light into green light is β3-SiAlON:Eu. An example of the fluorescent body that converts blue-violet light into blue light is $(Ba, Sr) MgAl_{10}O_{17}$:Eu. These fluorescent bodies are connected by an inorganic binder (such as silica or $TiO_2$). White light is obtained by mixing the fluorescent light, that is, the red light, the green light and the blue light emitted from the fluorescent member 22. The red light is light that has a center wavelength of, for example, about 640 nm; the green light is light that has a center wavelength of, for example, about 520 nm. The blue light is light that has a center wavelength of, for example, about 450 nm The fluorescent member 22 contains the fluorescent bodies at a high density.

Specifically, a volume occupation rate of the fluorescent bodies in the fluorescent member 22 is about 90% or more. The fluorescent member 22 contains about 90 mass percent or more of fluorescent bodies. Thus, even when the thickness of the fluorescent member 22 is small, it is possible to reduce the transmission of the laser light by the fluorescent member 22, and to effectively convert the laser light into the fluorescent light. Moreover, the laser light that has entered the application surface 22a of the fluorescent member 22 is more likely to be converted into the fluorescent light in the vicinity of the application surface 22a, and the fluorescent light is more likely to be emitted from the application surface 22a. The volume occupation rate and the mass percent described above are preferably about 99% or more.

As shown in FIG. 1, the fluorescent member 22 is arranged in a region that includes a focus point F23 of the reflective surface 23a (the first reflective surface) of the reflective member 23; the center of the application surface 22a of the fluorescent member 22 substantially coincides with the focus point F23 of the reflective surface 23a. The fluorescent member 22 may be arranged in the vicinity of the focus point F23 of the reflective surface 23a of the reflective member 23.

As shown in FIG. 19, the application surface 22a of the fluorescent member 22 is inclined at only an angle β1 (for example, about 27 degrees) that is more than 0 degrees but equal to or less than 30 degrees with respect to the light projection direction (A direction) toward the B direction.

Figure 23:
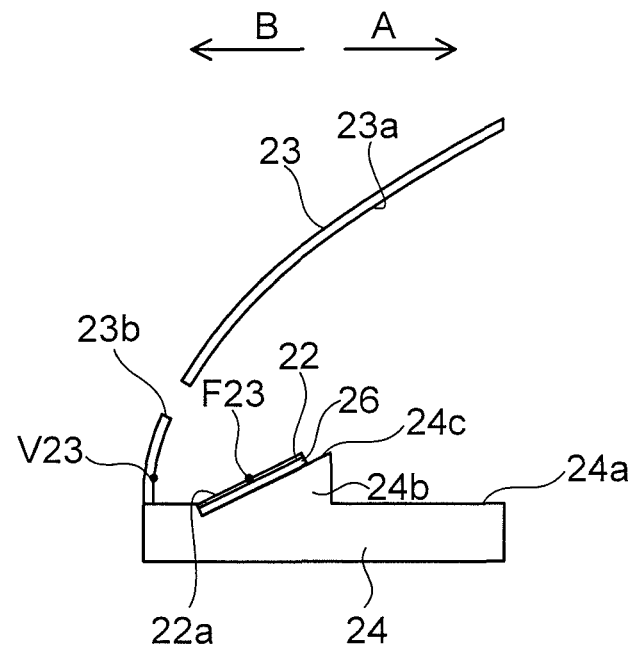
FIG. 23 is a cross-sectional view illustrating the structure of a reflective member according to the first embodiment of the present invention.
Figure 24:
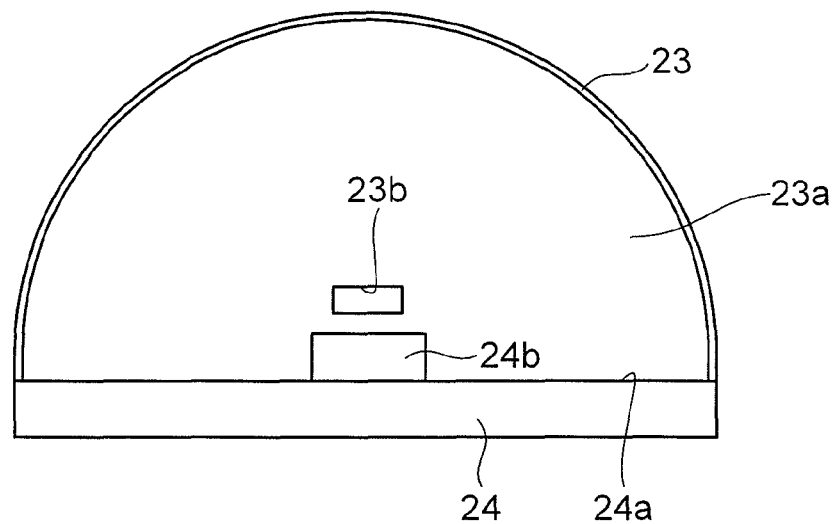
FIG. 24 is a front view illustrating the structure of the reflective member according to the first embodiment of the present invention.

As shown in FIG. 23, the reflective surface 23a of the reflective member 23 is arranged so as to face the application surface 22a of the fluorescent member 22. The reflective surface 23a is formed to include, for example, part of a paraboloidal surface. Specifically, the reflective surface 23a is formed such that the paraboloidal surface is divided by a plane that is perpendicular to (intersects) an axis connecting a vertex V23 and the focus point F23 and is divided by a plane that is parallel to the axis connecting the vertex V23 and the focus point F23. As shown in FIGS. 23 and 24, the reflective surface 23a has a depth (length in the B direction) of about 30 mm and is formed substantially in the shape of a semicircle that has a radius of about 30 mm as seen in the light projection direction (the A direction).

The reflective surface 23a also has the function of converting the light from the fluorescent member 22 into parallel light and of reflecting it in the predetermined direction (A direction). However, in actuality, since the spot region (the application region) of the laser light on the application surface 22a has a predetermined size, the light emitted from the reflective member 23 is not perfect parallel light; however, in the present specification, for ease of description, a description in which parallel light is emitted from the reflective member 23 may be given.

A penetration hole 23b is formed in a portion of the reflective member 23 extending in the B direction with respect to the center of the fluorescent member 22. The top portion of the light collection member 21 is inserted through the penetration hole 23b.

The reflective member 23 may be formed of a metal or may be formed by providing a reflective film on the surface of a resin.

The attachment member 24 is fixed to the reflective member 23. The upper surface 24a of the attachment member 24 is preferably formed to have the function of reflecting the light. The attachment member 24 is formed of a metal, such as Al or Cu, that has satisfactory thermal conductivity, and has the function of dissipating heat produced by the fluorescent member 22. The attachment portion 24b for fixing the fluorescent member 22 and the support plate 26 is formed integrally with the upper surface 24a of the attachment member 24. As shown in FIG. 19, an attachment surface 24c of the attachment portion 24b is inclined at only an angle (=the angle $\beta 1$) that is more than 0 degrees but equal to or less than 30 degrees with respect to the light projection direction (A direction) toward the B direction. A radiating fin (unillustrated) is preferably provided on the lower surface of the attachment member 24.

As shown in FIG. 1, in the opening portion (the end portion in the A direction) of the reflective member 23, the filter member 25 is provided that blocks (absorbs or reflects) excitation light (light having a wavelength of about 405 nm) and that transmits the fluorescent light (the red light, the green light and the blue light) obtained by converting the wavelength through the fluorescent member 22. Specifically, the filter member 25 absorbs light having a wavelength of, for example, about 418 nm or less and transmits light having a wavelength larger than about 418 nm. The filter member 25 can be formed with "ITY-418" made by Isuzu Glass Co., Ltd. or a glass material, such as "L42", that absorbs light having a wavelength of about 420 nm or less, that transmits light having a wavelength larger than about 420 nm and that is made by HOYA Corporation.

Figure 25:
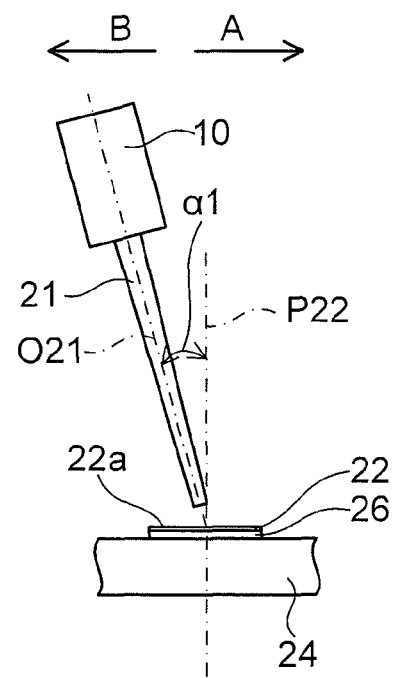
FIG. 25 is a diagram illustrating an experiment that has been performed for determining an optimum inclination angle of the light collection member with respect to a normal to the application surface of the fluorescent member.
Figure 26:
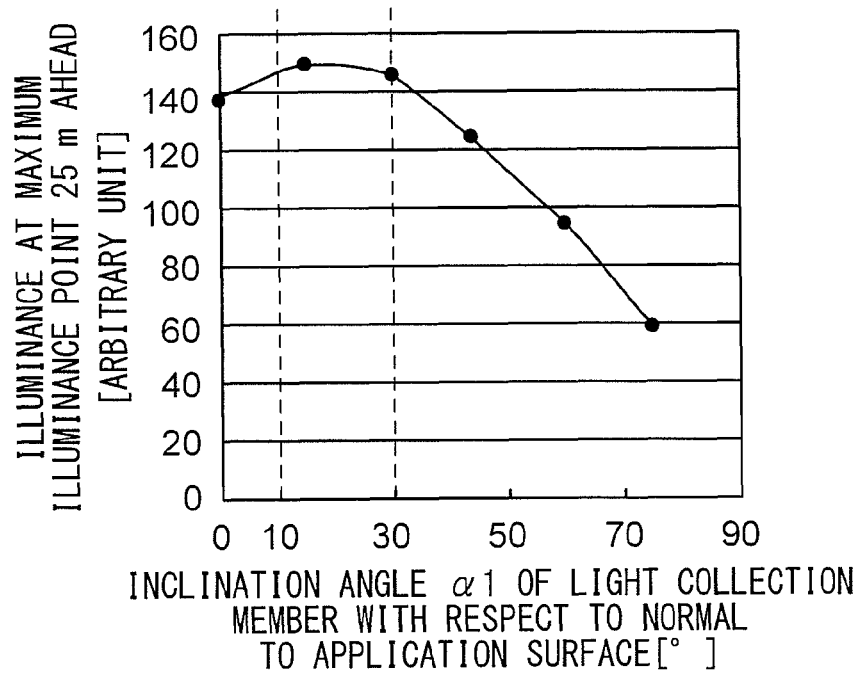
FIG. 26 is a diagram showing a relationship between the inclination angle of the light collection member with respect to the normal to the application surface of the fluorescent member and an illuminance of the maximum illuminance point.

With reference to FIGS. 25 and 26, the reason why the center axis O21 of the light collection member 21 is inclined at an angle that is equal to or more than 10 degrees but equal to or less than 30 degrees with respect to the normal P22 to the application surface 22a of the fluorescent member 22 will now be described. The inventor of the present application performed the following experiment for determining an optimum inclination angle of the center axis O21 of the light collection member 21 with respect to the normal P22 to the application surface 22a of the fluorescent member 22.

In this experiment, as shown in FIG. 25, the fluorescent member 22 was arranged such that the application surface 22a was parallel to the light projection direction (A direction), and the center axis O21 of the light collection member 21 was inclined at only $\alpha 1$ (=zero degrees to 75 degrees) with respect to the normal P22 to the application surface 22a, and the illuminance of the maximum illuminance point 25 m in front of the light projection device 1 was determined by simulation. The results thereof are shown in FIG. 26.

As shown in FIG. 26, when the inclination angle $\alpha 1$ of the center axis O21 of the light collection member 21 with respect to the normal P22 to the application surface 22a was about 10 degrees to about 30 degrees, the illuminance of the maximum illuminance point 25 m in front of the light projection device 1 was highest. This can be probably because of the following. As the inclination angle $\alpha 1$ becomes about 30 degrees or more, the spot region of the laser light on the application surface 22a becomes larger. Hence, a larger amount of light is excited and emitted in a position displaced from the focus point F23 of the reflective surface 23a, and thus the amount of light projected as parallel light is decreased. In this way, the illuminance of the maximum illuminance point 25 m in front of the light projection device 1 is probably decreased. On the other hand, as the inclination angle al becomes about 10 degrees or less (approaches 0 degrees), among the light emitted from the fluorescent member 22, light that enters (returns to) the light collection member 21 is increased, and the amount of light reaching the reflective surface 23a is reduced. Hence, the amount of light projected from the reflective surface 23a is reduced, and thus the illuminance of the maximum illuminance point 25 m in front of the light projection device 1 is probably decreased. In consideration of the above results, the center axis O21 of the light collection member 21 is inclined at an angle that is equal to or more than 10 degrees but equal to or less than 30 degrees with respect to the normal P22 to the application surface 22a of the fluorescent member 22.

The reason why the center axis O21 of the light collection member 21 is inclined with respect to the normal P22 to the application surface 22a in the B direction (the side opposite to the light projection direction) will be described below. When the center axis O21 of the light collection member 21 is inclined with respect to the normal P22 to the application surface 22a in the A direction, the light collection member 21 is arranged on the optical path of the light reflected off the reflective surface 23a. In this way, part of the light reflected off the reflective surface 23a enters the light collection member 21, and thus the efficiency of utilization of the light is reduced.

Figure 27:
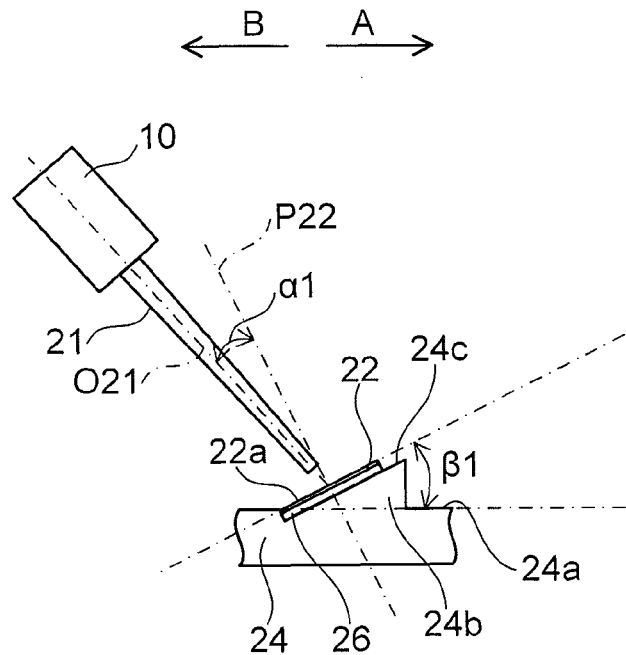
FIG. 27 is a diagram illustrating an experiment that has been performed for determining an optimum inclination angle of the application surface of the fluorescent member with respect to a light projection direction.
Figure 28:
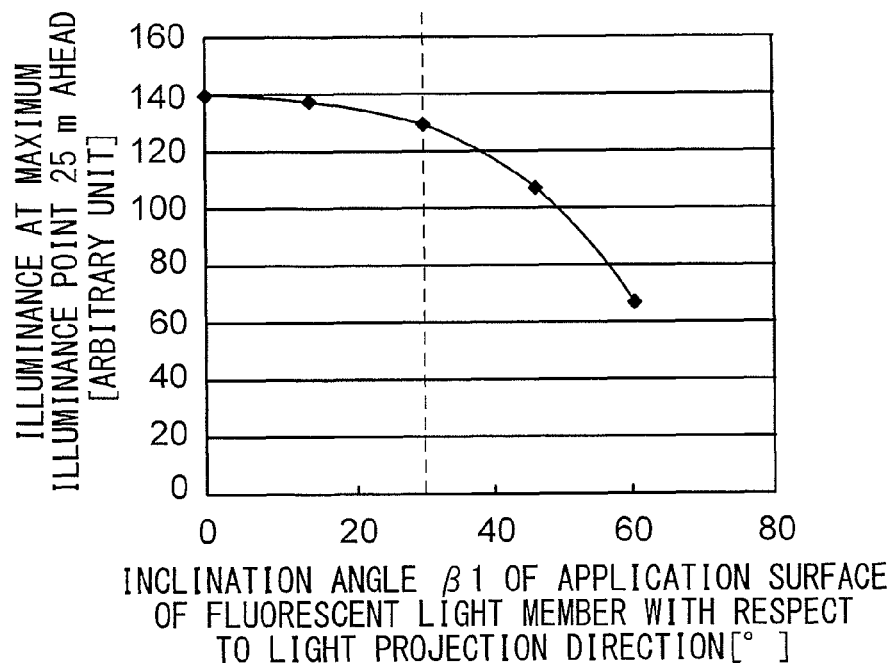
FIG. 28 is a diagram showing a relationship between the inclination angle of the application surface of the fluorescent member with respect to the light projection direction and the illuminance of the maximum illuminance point.

With reference to FIGS. 27 and 28, the reason why the application surface 22a of the fluorescent member 22 is inclined at only an angle that is more than 0 degrees but equal to or less than 30 degrees with respect to the light projection direction (A direction) will now be described. The inventor of the present application performed the following experiment for determining an optimum inclination angle of the application surface 22a of the fluorescent member 22 with respect to the light projection direction (A direction).

In this experiment, as shown in FIG. 27, the inclination angle $\alpha 1$ of the light collection member 21 was set at 75 degrees, and the application surface 22a of the fluorescent member 22 was inclined at the angle $\beta 1$ (=0 degrees to 60 degrees) with respect to the light projection direction (A direction), and the illuminance of the maximum illuminance point 25 m in front of the light projection device 1 was determined by simulation. The results thereof are shown in FIG. 28.

As shown in FIG. 28, when the inclination angle β1 of the application surface 22a of the fluorescent member 22 with respect to the light projection direction (A direction) was 0 degrees to about 30 degrees, the illuminance of the maximum illuminance point 25 m in front of the light projection device 1 was increased. Specifically, when the inclination angle β1 was 0 degrees, the illuminance of the maximum illuminance point was highest; as the inclination angle β1 was increased, the illuminance of the maximum illuminance point tended to be decreased. When the inclination angle β1 was about 30 degrees or less, the decrease in the illuminance was reduced by only about 10% as compared with the case where the inclination angle β1 was 0 degrees.

The reason why, as the inclination angle β1 was increased, the illuminance of the maximum illuminance point was decreased can be probably the following. In the reflective surface 23a, the curvature around the vertex V23 (see FIG. 23) is great, and the curvature is decreased toward the opening portion. If the spot region of the laser light is so small as to be regarded as a point, both light reflected around the vertex V23 of the reflective surface 23a and light reflected around the opening portion are converted into parallel light. However, in actuality, the spot region has a certain size (for example, φ2 mm), and light is also emitted from a position slightly displaced with respect to the focus point F23 of the reflective surface 23a and is reflected off the reflective surface 23a. Here, since the curvature around the vertex V23 is great, the light reflected around the vertex V23 is unlikely to be converted into parallel light and is unlikely to reach the maximum illuminance point as compared with the light reflected around the opening portion. Then, as the inclination angle β1 is increased, the amount of light reflected around the opening portion of the reflective surface 23a is decreased, with the result that the illuminance of the maximum illuminance point is probably reduced.

However, when the inclination angle β1 is decreased, the amount of light that is directly emitted to the outside without passing through the reflective member 22 is increased. In other words, the amount of light that can be controlled by the reflective member 22 is decreased. Thus, the illuminance in a predetermined range in front of the light projection device 1 is collectively reduced. In consideration of the above results, the inclination angle β1 is preferably more than 0 degrees but equal to or less than 30 degrees.

Figure 29:
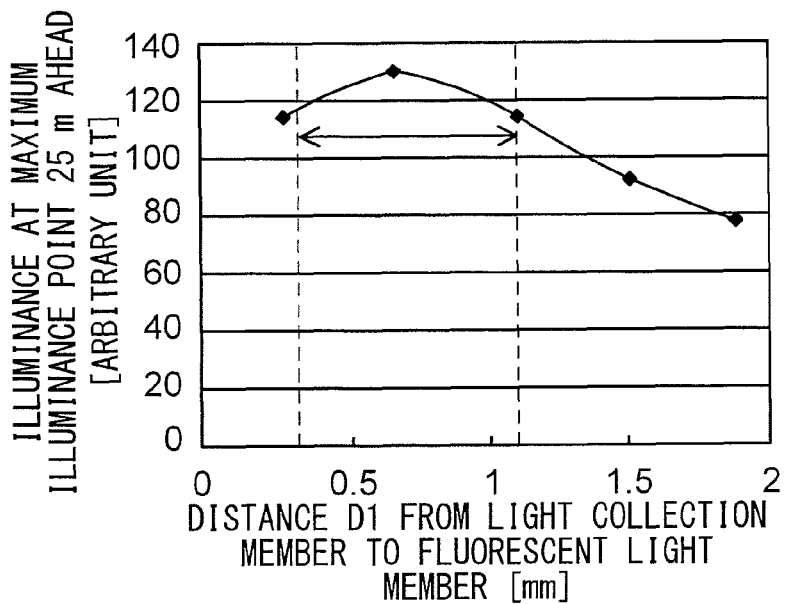
FIG. 29 is a diagram showing a relationship between a distance from the light emission surface of the light collection member to the application surface of the fluorescent member and the illuminance of the maximum illuminance point.

With reference to FIGS. 19 and 29, the reason why the light emission surface 21b of the light collection member 21 is arranged the distance that is equal to or more than about 0.3 mm but equal to or less than 1.1 mm away from the application surface 22a of the fluorescent member 22 will now be described. The inventor of the present application performed the following experiment for determining an optimum distance from the light emission surface 21b of the light collection member 21 to the application surface 22a of the fluorescent member 22.

In this experiment, as shown in FIG. 19, the inclination angle α1 of the light collection member 21 was set at 30 degrees, and the inclination angle β1 of the fluorescent member 22 was set at 27 degrees, and the illuminance of the maximum illuminance point 25 m in front of the light projection device 1 was determined by simulation. The results thereof are shown in FIG. 29.

As shown in FIG. 29, when the distance D1 from the light emission surface 21b of the light collection member 21 to the application surface 22a of the fluorescent member 22 was equal to or more than about 0.3 mm but equal to or less than about 1.1 mm, the illuminance of the maximum illuminance point was highest. When the distance D1 was equal to or more than about 0.3 mm but equal to or less than about 1.1 mm, the decrease in the illuminance was reduced by only about 10%.

The reason why, when the distance D1 was less than about 0.3 mm or was more than about 1.1 mm, the illuminance of the maximum illuminance point was decreased can be probably the following. As the distance D1 is decreased, among the light emitted from the fluorescent member 22, the amount of light that enters (returns to) the light collection member 21 is increased, with the result that the amount of light reaching the reflective surface 23a is reduced. Hence, the amount of light projected from the reflective surface 23a is reduced, and thus the illuminance of the maximum illuminance point 25 m in front of the light projection device 1 is probably decreased. As the distance D1 is increased, the spot region of the laser light on the application surface 22a is made larger. Hence, the amount of light that is excited and emitted in a position displaced from the focus point F23 of the reflective surface 23a is increased, and thus the amount of light projected as parallel light is decreased. In this way, the illuminance of the maximum illuminance point 25 m in front of the light projection device 1 is probably decreased. In consideration of the above results, the light emission surface 21b of the light collection member 21 is arranged the distance that is equal to or more than about 0.3 mm but equal to or less than 1.1 mm away from the application surface 22a of the fluorescent member 22.

In the present embodiment, as described above, there is provided the light collection member 21 including the light entrance surface 21a that the laser light enters, the light emission surface 21b that has an area smaller than that of the light entrance surface 21a and that emits the laser light and the upper surface 21c, the lower surface 21d and the pair of the side surfaces 21e which reflect the laser light entering the light entrance surface 21a and which guide it to the light emission surface 21b. In this way, the laser light that has entered the light entrance surface 21a travels within the light collection member 21 while being reflected off the upper surface 21c, the lower surface 21d and the pair of the side surfaces 21e, and is emitted from the light emission surface 21b with uniform light intensity distribution. In other words, the light intensity distribution of the laser light emitted from the light emission surface 21b is not Gaussian distribution. Hence, it is possible to reduce the production of a portion where the light density is excessively increased on the application surface 22a of the fluorescent member 22. In this way, it is possible to reduce the degradation of the fluorescent bodies and the binder included in the fluorescent member 22 by heat and the degradation by a chemical reaction caused by light.

The light collection member 21 has no focus point (light collection point) unlike a light collection lens or the like. In other words, the laser light emitted from the light collection member 21 is not collected into one point. Hence, even when vibration, aged deterioration or the like causes the displacement of the semiconductor laser element 11, the light collection member 21 or the fluorescent member 22, it is possible to reduce significant variations in the light density on the application surface 22a of the fluorescent member 22. Thus, it is possible to reduce the production of a portion where the light density is excessively increased in the fluorescent member 22. Even when the semiconductor laser element 11 is displaced with respect to the light collection member 21, the spot position (the application position) of the laser light on the application surface 22a is little changed. Hence, since the semiconductor laser elements 11 do not need to be accurately positioned with respect to the light collection member 21, it is possible to easily assemble the light projection device 1.

As described above, the fluorescent member 22 that mainly emits fluorescent light from the application surface 22a is provided, and thus most of the light (fluorescent light) emitted from the fluorescent member 22 can be reflected off the reflective member 23. In other words, most of the light emitted from the fluorescent member 22 can be controlled by the reflective member 23. Hence, it is possible to effectively illuminate a desired region.

Since the light emission surface 21b of the light collection member 21 has an area smaller than that of the light entrance surface 21a, the laser light that has been collected is emitted from the light emission surface 21b. In this way, since the spot region of the laser light on the application surface 22a of the fluorescent member 22 can be reduced, it is possible to reduce the light emission region of the fluorescent member 22. Hence, it is possible to effectively illuminate a desired region.

The light emission surface 21b of the light collection member 21 is arranged the predetermined distance D1 away from the application surface 22a of the fluorescent member 22, and thus it is possible to reduce the entrance (return) of the light emitted from the application surface 22a of the fluorescent member 22 into the light emission surface 21b of the light collection member 21. Thus, it is possible to reduce the decrease in the efficiency of utilization of the light.

As described above, the light collection member 21 is inclined with respect to the normal P22 to the application surface 22a of the fluorescent member 22. Since the light intensity of the light emitted from the fluorescent member 22 in the direction of the normal to the application surface 22a is highest, the light collection member 21 is inclined with respect to the normal P22 to the application surface 22a of the fluorescent member 22, and thus it is possible to more reduce the entrance of the light emitted from the application surface 22a of the fluorescent member 22 into the light emission surface 21b of the light collection member 21. In this way, it is possible to more reduce the decrease in the efficiency of utilization of the light.

As described above, the light collection member 21 is inclined with respect to the normal P22 to the application surface 22a of the fluorescent member 22 in the B direction. Thus, it is possible to reduce the entrance of the light reflected off the reflective member 23 and travelling in the predetermined direction (A direction) into the light collection member 21. In other words, it is possible to reduce the arrangement of the light collection member 21 on the optical path of the light reflected off the reflective member 23. Thus, it is possible to more reduce the decrease in the efficiency of utilization of the light.

As described above, the application surface 22a of the fluorescent member 22 is inclined with respect to the predetermined direction (A direction) in the B direction. Thus, it is possible to reduce the direct emission of the light emitted from the fluorescent member 22 to the outside without the light passing through the reflective member 23. In other words, it is possible to reduce the amount of light that is not controlled by the reflective member 23. In this way, it is possible to reduce the decrease in the amount of light that reaches a desired region.

As described above, the attachment surface 24c is inclined with respect to the predetermined direction (A direction) in the B direction, and thus it is possible to easily incline the application surface 22a of the fluorescent member 22 with respect to the predetermined direction (A direction) in the B direction even if the fluorescent member 22 and the support plate 26 are uniform in thickness. Since the fluorescent member 22 and the support plate 26 are formed such that their thickness becomes uniform, it is possible to easily manufacture the fluorescent member 22 and the support plate 26.

As described above, the volume occupation rate of the fluorescent bodies in the fluorescent member 22 is set at 90% or more, and thus it is possible to reduce the transmission of the laser light by the fluorescent member 22 even when the thickness of the fluorescent member 22 is small, with the result that it is possible to effectively convert the laser light into fluorescent light. The laser light applied to the fluorescent member 22 is more likely to be converted into fluorescent light in the vicinity of the application surface 22a of the fluorescent member 22. Hence, it is possible to easily and mainly emit fluorescent light from the application surface 22a of the fluorescent member 22.

As described above, the light intensity distribution of the fluorescent light emitted from the fluorescent member 22 is Lambertian distribution. Thus, the light intensity of the light emitted from the fluorescent member 22 in the direction of the normal to the application surface 22a is great, and the light intensity in a direction parallel to the application surface 22a becomes substantially zero. Thus, it is possible to more reduce the direct emission of the light emitted from the fluorescent member 22 to the outside without the light passing through the reflective member 23.

As described above, the thickness of the fluorescent member 22 is one-tenth or less of the overall dimension (width, length) of the application surface 22a. Moreover, the application surface 22a of the fluorescent member 22 is sufficiently larger than the spot region of the laser light applied to the application surface 22a. Thus, the light intensity distribution of the fluorescent light emitted from the fluorescent member 22 can easily be Lambertian distribution.

As described above, the fluorescent member 22 is attached to the metallic attachment member 24, and thus it is possible to effectively dissipate the heat produced by the fluorescent member 22. Thus, since the increase in the temperature of the fluorescent member 22 can be reduced, it is possible to reduce the degradation of the fluorescent member 22 by the heat and the decrease in the efficiency of light emission by the fluorescent member 22.

As described above, the reflective surface 23a is formed to include part of the paraboloidal surface. In this way, the fluorescent member 22 is positioned in the focus point F23 of the reflective surface 23a, and thus it is possible to easily convert the light (illumination light) emitted from the light projection unit 20 into parallel light.

As described above, the reflective surface 23a is formed such that the paraboloidal surface is divided by the plane that intersects the axis connecting the focus point F23 and the vertex V23 and is divided by the plane that is parallel to the axis connecting the focus point F23 and the vertex V23. Thus, it is possible to reduce the size of the reflective member 23 and the light projection unit 20.

As described above, the cross section perpendicular to the direction in which the light is guided by the light collection member 21 is formed to be rectangular with the corners thereof chamfered, and thus it is possible to reduce the dispersion of the laser light on the edges (the corners of the cross section) of the light collection member 21. In this way, it is possible to reduce the leakage of the laser light from the light collection member 21, and thus it is possible to enhance the efficiency of utilization of the laser light.

With the light collection member 21 described above, it is possible to easily collect the laser light emitted from a plurality of semiconductor laser elements 11. Hence, when a plurality of semiconductor laser elements 11 are used as the light source, the use of the light collection member 21 described above is particularly effective.

As described above, the light collection member 21 is inclined at an angle that is equal to or more than 10 degrees but equal to or less than 30 degrees with respect to the normal P22 to the application surface 22a of the fluorescent member 22. Thus, it is possible to increase the illuminance of the maximum illuminance point in a desired region.

As described above, the light emission surface 21b of the light collection member 21 is arranged the distance D1 that is equal to or more than 0.3 mm but equal to or less than 1.1 mm away from the application surface 22a of the fluorescent member 22. Thus, it is possible to increase the illuminance of the maximum illuminance point in the desired region.

As described above, the application surface 22a of the fluorescent member 22 is inclined at the angle β1 that is more than 0 degrees but equal to or less than 30 degrees with respect to the predetermined direction (A direction). Thus, it is possible not only to reduce the decrease in the illuminance of the maximum illuminance point in the desired region but also to reduce the overall decrease in the illuminance of the desired region.

(Second Embodiment)

The structure of a light projection device 101 according to a second embodiment of the present invention will now be described with reference to FIGS. 30 to 34.

Figure 30:
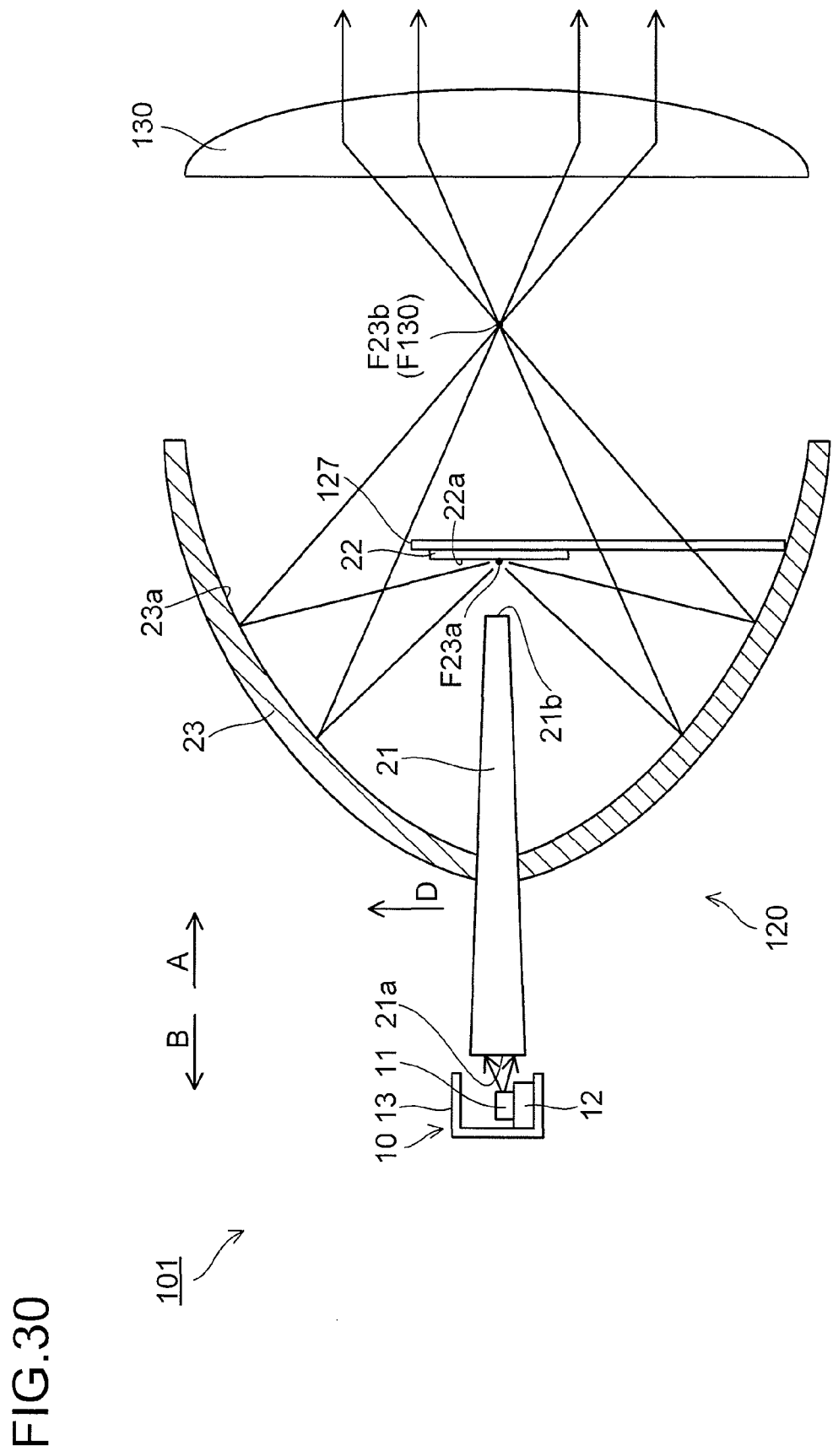
FIG. 30 is a cross-sectional view showing the structure of a light projection device according to a second embodiment of the present invention.

As shown in FIG. 30, in the light projection device 101 according to the second embodiment of the present invention, a light projection device 120 includes the light collection member 21, the fluorescent member 22, the reflective member 23, a support member 127 that supports the fluorescent member 22 and a lens 130 (light projection member) that transmits and then projects fluorescent light.

Figure 31:
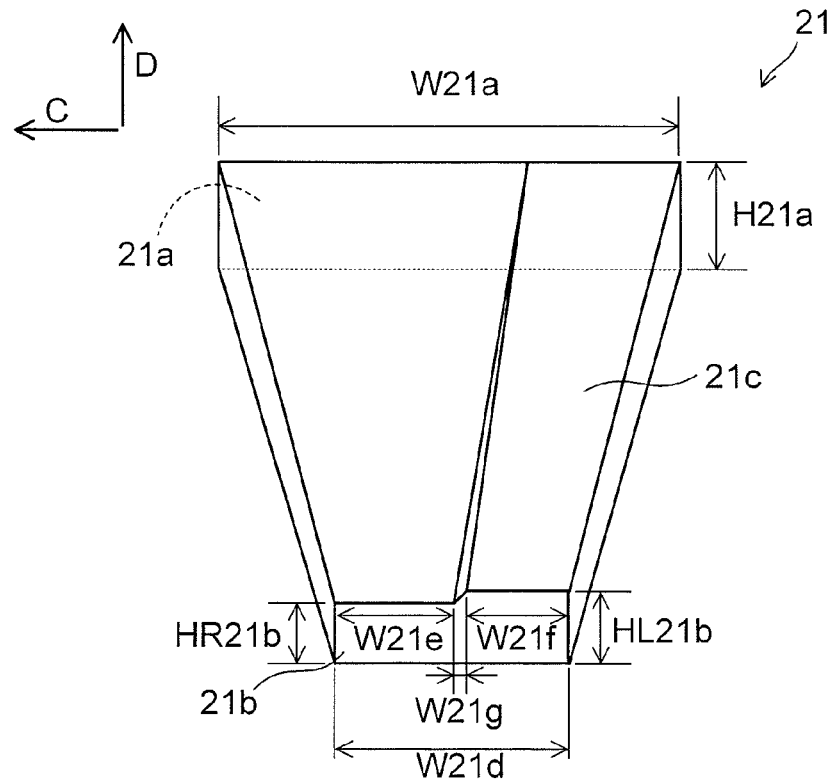
FIG. 31 is a perspective view showing the structure of a light collection member according to the second embodiment of the present invention.

In the light collection member 21 of the present embodiment, as shown in FIG. 31, the light entrance surface 21a is formed to be rectangular. Unlike in the embodiment described above, the light emission surface 21b is asymmetrically formed in a left/right direction, and is formed in a shape corresponding to a light projection pattern P of a low beam (passing headlight). Specifically, the light entrance surface 21a has a height (H21a) of about 3 mm and a width (W21a) of about 10 mm. The light emission surface 21b is formed such that an upper right portion is cut, and thus the heights of the left and right sides are different. The left means the left side (the side opposite to a C direction) as seen in the direction in which the automobile drives; it is the right in FIG. 31. The right means the right side (the side in the C direction) as seen in the direction in which the automobile drives; it is the left in FIG. 31. The left portion of the light emission surface 21b has a height (HL21b) of about 1.9 mm, and the right portion has a height (HR21b) of about 1.5 mm. An end portion of the lower surface 21d on the side of the light emission surface 21b has a width (W21d) of about 6 mm. W21e of FIG. 31 is a width of about 3 mm; W21f is a width of about 2.6 mm. W21g is a width of about 0.4 mm.

As in the first embodiment, the light intensity distribution of the laser light on the light emission surface 21b of the light collection member 21 according to the present embodiment is uniform.

As shown in FIG. 30, the light emission surface 21b of the light collection member 21 is arranged a predetermined distance away from the application surface 22a of the fluorescent member 22. The center axis of the light collection member 21 is arranged perpendicular to the application surface 22a of the fluorescent member 22.

The fluorescent member 22 is arranged in a region including a first focus point F23a of the reflective surface 23a of the reflective member 23. The application surface 22a of the fluorescent member 22 is arranged perpendicular to the light projection direction (A direction). The fluorescent member 22 is provided on the bar-shaped support member 127 that is formed of, for example, a metal. For example, the fluorescent member 22 is formed by applying a resin containing fluorescent body particles onto the support member 127 and curing it. The support member 127 is fixed to the reflective surface 23a of the reflective member 23. The support member 127 may be formed of, for example, a glass, a resin or the like that transmits the light emitted from the fluorescent member 22.

Figure 32:
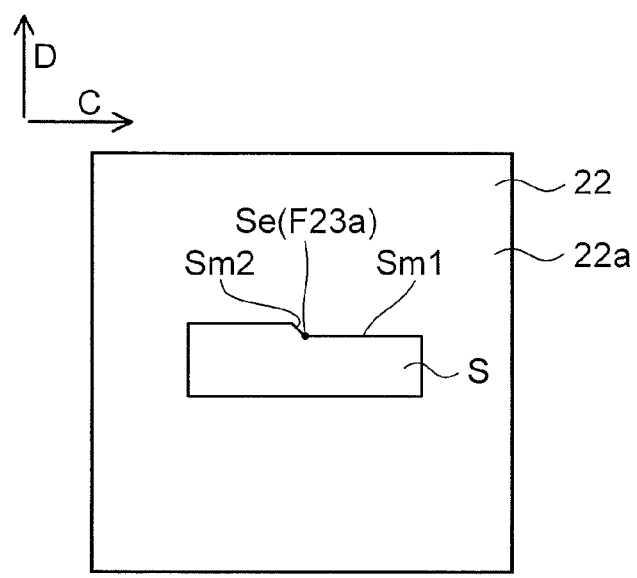
FIG. 32 is a diagram illustrating an application region of a fluorescent member according to the second embodiment of the present invention.

In the present embodiment, when the laser light is applied to the fluorescent member 22, an application region S of the fluorescent member 22 is asymmetrical in a left/right direction as shown in FIG. 32. Specifically, as with the light emission surface 21b of the light collection member 21, the application region S is formed such that the light projection pattern P of the low beam (passing headlight) is a projected image, and is shaped such that an upper right portion is cut. In the application region S, lines Sm1 and Sm2 and a point Se are formed such that cut-off lines M1 and M2 and an elbow point E, describe later, of the light projection pattern P are a projected image. The lines Sm1 and Sm2 are part of an edge portion of the application region S. The point Se is the intersection point of the lines Sm1 and Sm2.

As shown in FIG. 30, the reflective surface 23a of the reflective member 23 is formed to include part of an elliptical surface. Specifically, the reflective surface 23a is formed in a shape obtained by dividing the elliptical surface by a plane perpendicular to (intersecting) an axis connecting the first focus point F23a and a second focus point F23b. The reflective surface 23a has a depth (length in the B direction) of about 30 mm, and is formed to be circular with a radius of about 15 mm, as seen in the light projection direction (A direction).

The first focus point F23a of the reflective surface 23a of the reflective member 23 is arranged to substantially coincide with the point Se (the intersection point of the lines Sm1 and Sm2) of the application region S of the fluorescent member 22. In other words, the first focus point F23a is arranged in a position of the application region S where the elbow point E, described later, of the light projection pattern P is projected.

The lens 130 is arranged in front of the reflective member 23. The lens 130 has a radius of about 15 mm. The focus point F130 of the lens 130 substantially coincides with the second focus point F23b of the reflective surface 23a of the reflective member 23. The lens 130 may be a plano-convex lens, a biconvex lens or a lens of another shape.

Figure 33:
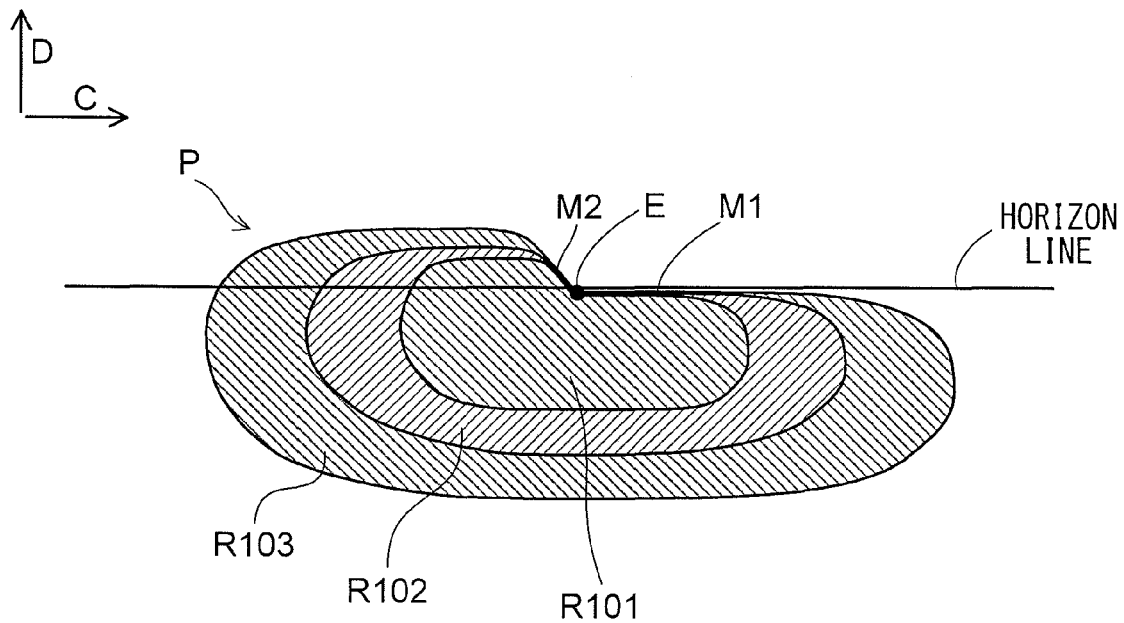
FIG. 33 is a diagram illustrating a light projection pattern 25 m in front of the light projection device according to the second embodiment of the present invention.

In the present embodiment, the light emitted from the application region S of the fluorescent member 22 is reflected off the reflective surface 23a of the reflective member 23, passes through the second focus point F23b of the reflective surface 23a and is projected by the lens 130. Then, as shown in FIG. 33, the light projection pattern P 25 m in front of the light projection device 101 has a shape that is reflected by the application region S.

Specifically, the light projection pattern P does not extend in an upper right direction, and extends both in a left/right direction (horizontal direction) and in a downward direction. In this light projection pattern P, light and dark areas are rapidly switched by the cut-off lines M1 and M2, and illumination light is not applied to a region above the cut-off lines M1 and M2. Specifically, the light projection pattern P is formed in such a shape that an upper right portion is cut. Thus, it is possible to reduce glare light that is given to the driver of an oncoming automobile. The illuminance of a region R101 (a region directly in front of the automobile) in the vicinity of the elbow point E that is the intersection point of the cut-off lines M1 and M2 is highest; as the area is farther away from the region R101, the illuminance thereof is decreased. Specifically, the illuminances of the regions R101, R102 and R103 are decreased in this order.

Figure 34:
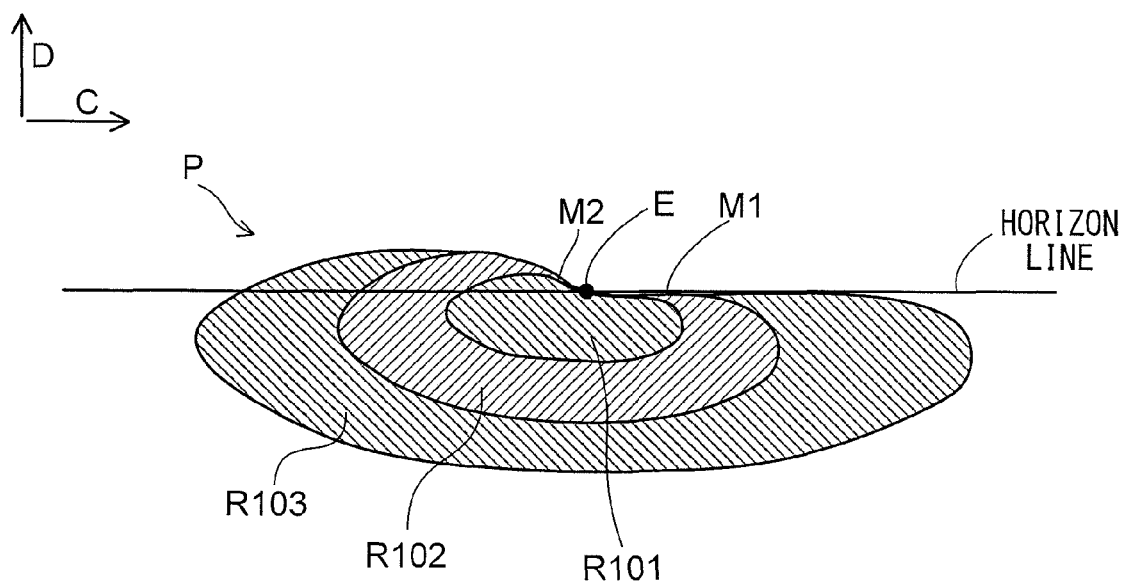
FIG. 34 is a diagram illustrating a light projection pattern required for a low beam of an automobile.

In a country, such as Japan, where an automobile drives on the left, as shown in FIG. 34, the low beam of the automobile is required to have the light projection pattern P obtained by cutting an upper right portion. The cut-off lines M1 and M2 are required to rapidly switch light and dark areas so as not to give glare light to the driver of the oncoming automobile.

As described above, in the light projection device 101 of the present embodiment, the light projection pattern P that is required as the low beam of the automobile is fully satisfied.

The other parts of the structure in the second embodiment are the same as in the first embodiment.

In the present embodiment, as described above, the light emission surface 21b is asymmetrical in the left/right direction. In this way, the application region S can easily be made asymmetrical in the left/right direction, and thus the light projection pattern P can easily be made asymmetrical in the left/right direction.

In the present embodiment, as described above, the first focus point F23a of the reflective surface 23a of the reflective member 23 is arranged on the lines Sm1 and Sm2 that are a portion of the application region S where the cut-off lines M1 and M2 of the light projection pattern P are projected. In this way, light and dark areas are rapidly switched by the cut-off lines M1 and M2, which is particularly effective.

As described above, the first focus point F23a of the reflective surface 23a of the reflective member 23 is arranged in a position of the application region S where the elbow point E of the light projection pattern P is projected. In this way, it is possible to rapidly switch light and dark areas in the vicinity of the elbow point E, which is more effective. It is also possible to most brighten the vicinity of the elbow point E. In other words, it is possible to most brighten the region (the region R101) directly in front of the automobile. The first focus point F23a is arranged in the position (the center position of the application region S in the left/right direction) of the application region S where the elbow point E is projected, and thus it is possible to form the lower portion of the light projection pattern P such that the lower portion is substantially symmetrical in the left/right direction.

As described above, the light emitted from the application region S is reflected off the reflective surface 23a, passes through the second focus point F23b of the reflective surface 23a and is projected by the lens 130. Here, since the second focus point F23b of the reflective surface 23a coincides with the focus point F130 of the lens 130, the light projection pattern P formed by the lens 130 is a pattern that is obtained by projecting the shape of the application region S. When the light is projected using the lens 130, as compared with a case where the light is projected by the reflective member 23 without the provision of the lens 130, the shape of the application region S is more easily reflected on the light projection pattern P. The reflective member 23 is provided, and thus it is possible to utilize, as compared with the case where the light is projected by the lens 130 without the provision of the reflective member 23, a larger amount of light emitted from the fluorescent member 22 as the illumination light. In this way, it is possible to enhance the efficiency of utilization of the light.

The other effects in the second embodiment are the same as in the first embodiment.

(Third Embodiment)

The structure of a light projection device 201 according to a third embodiment of the present invention will now be described with reference to FIG. 35.

Figure 35:
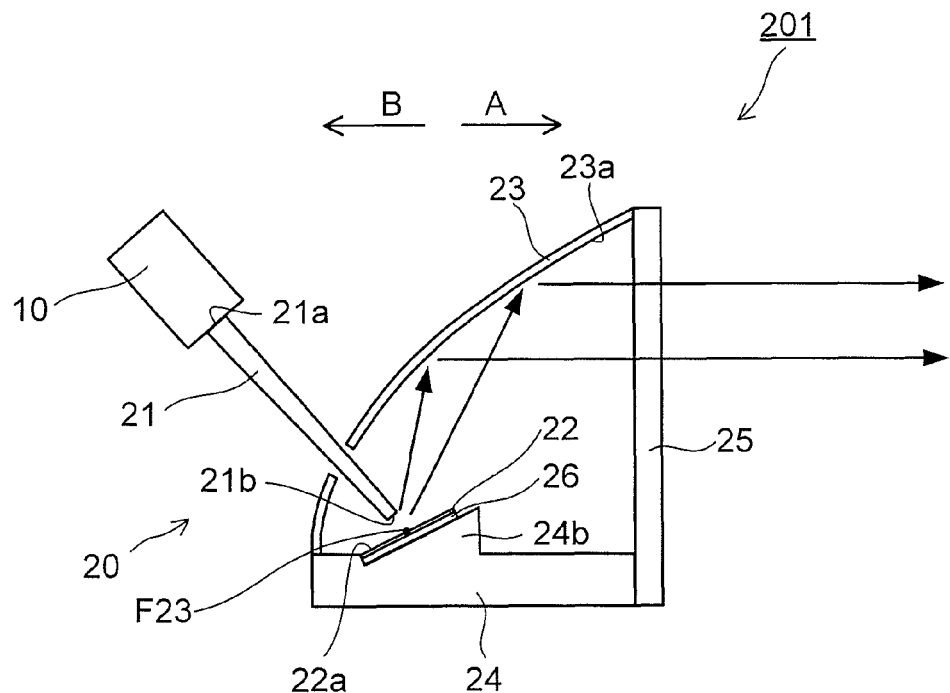
FIG. 35 is a cross-sectional view showing the structure of a light projection device according to a third embodiment of the present invention.

In the light projection device 201 according to the third embodiment of the present invention, as shown in FIG. 35, the reflective member 23 is formed as with the reflective member 23 of the first embodiment described above.

As in the second embodiment, the focus point F23 of the reflective surface 23a of the reflective member 23 is arranged to substantially coincide with the point Se (the intersection point of the lines Sm1 and Sm2) of the application region S of the fluorescent member 22.

The light collection member 21 of the present embodiment is formed as with the light collection member 21 of the second embodiment described above.

In the present embodiment, the light emitted from the application region S of the fluorescent member 22 is projected by being reflected off the reflective surface 23a of the reflective member 23.

The other parts of the structure in the third embodiment are the same as in the first embodiment.

The other effects in the third embodiment are the same as in the first and second embodiments.

It should be considered that the embodiments disclosed herein are illustrative in all respects and not restrictive. The scope of the present invention is indicated not by the description of the embodiments described above but by the scope of claims; the scope of the present invention includes meanings equivalent to the scope of claims and all modifications within the scope.

For example, although, in the embodiments described above, the description has been given of the example where the light projection device of the present invention is used as the headlight for the automobile, the present invention is not limited to this example. The light projection device of the present invention may be used as a headlight for an airplane, a ship, a robot, a motorbike or a bicycle or another moving unit.

Although, in the embodiments described above, the description has been given of the example where the light projection device of the present invention is applied to the headlight, the present invention is not limited to this example. The light projection device of the present invention may be applied to a downlight, a spotlight or another light projection device.

Although, in the embodiments described above, the description has been given of the example where excitation light is converted into visible light, the present invention is not limited to this example, and the excitation light may be converted into light other than visible light. For example, when the excitation light is converted into infrared light, it can be applied to a night illumination device of a security CCD camera or the like.

Although, in the embodiments described above, the description has been given of the example where the excitation light source (semiconductor laser elements) and the fluorescent member are configured to emit white light, the present invention is not limited to this example. The excitation light source and the fluorescent member may be configured to emit light other than white light.

Although, in the embodiments described above, the description has been given of the example where the semiconductor laser element is used as the laser generator for emitting laser light, the present invention is not limited to this example, and a laser generator other than the semiconductor laser element may be used.

The values described in the embodiments discussed above are examples, and the values are not limited.

The center wavelength of the laser light emitted from the semiconductor laser elements of the present embodiments described above and the type of fluorescent bodies that form the fluorescent member can be changed as appropriate. For example, white light may be obtained by using a semiconductor laser element that emits blue laser light having a center wavelength of about 450 nm and a fluorescent body that converts part of the blue laser light into yellow light. In this case, the filter member that blocks the excitation light may be omitted. An example of the fluorescent body that converts part of the blue laser light into yellow light is $(Y_{1-x-y}Gd_xCe_y)_3 Al_5O_{12}$ ($0.1 \leq x \leq 0.55$, $0.01 \leq y \leq 0.4$). The present invention is not limited to what has been described above, and the center wavelength of the laser light emitted from the semiconductor laser element may be freely selected within the range from ultraviolet light to visible light.

Although, in the embodiments described above, the description has been given of the example where the reflective surface of the reflective member is formed with part of the paraboloidal surface or part of the elliptical surface, the present invention is not limited to this example. The reflective surface may be formed with a multi-reflector that is formed with a large number of curved surfaces (for example, paraboloidal surfaces), a free curved surface reflector in which a large number of minute flat surfaces are continuously provided or the like.

Although, in the embodiments described above, the description has been given of the example where the reflective member and the attachment member are provided separately, the present invention is not limited to this example, and the reflective member and the attachment member may be formed integrally.

Although, in the embodiments described above, the description has been given of the example where a plurality of semiconductor laser elements are used as the excitation light source, the present invention is not limited to this example. One semiconductor laser element may be used as the excitation light source. A so-called semiconductor laser array that incorporates a plurality of light emission portions as the excitation light source may be used.

Although, in the embodiments described above, the description has been given of the example where the light collection member is fixed to the laser generation device, the present invention is not limited to this example. The light collection member may be fixed to the reflective member, the attachment member, the support plate or the fluorescent member.

Although, in the embodiments described above, the description has been given of the example where the gap (space) is formed between the light emission surface of the light collection member and the application surface of the fluorescent member, the present invention is not limited to this example. A resin, glass or the like may be arranged between the light emission surface of the light collection member and the application surface of the fluorescent member; the interior of the reflective surface of the reflective member may be filled with resin, glass or the like.

In the embodiments described above, the description has been given of the example where the laser light is converted into fluorescent light in the vicinity of the application surface of the fluorescent member and is emitted from the application surface. In other words, although the description has been given of the example where the laser light and the fluorescent light do not reach the side of the back surface of the fluorescent member, the present invention is not limited to this example. The surface of the support plate in contact with the back surface of the fluorescent member may be formed with the reflective surface such that no fluorescent light is practically emitted from the back surface of the fluorescent member. In this case, the fluorescent body does not need to have such a high density as described in the embodiments discussed above. However, when the laser light does not reach the side of the back surface of the fluorescent member and is converted into fluorescent light in the vicinity of the application surface, the efficiency of light emission is high. Therefore, the fluorescent body preferably has a high density.

Although, in the first and third embodiments, the description has been given of the example where the fluorescent member is formed on the support plate, the present invention is not limited to this example. For example, the fluorescent member may be formed directly on the attachment portion of the attachment member. For example, portions corresponding to the support plate and the attachment portion may be formed with the fluorescent member without the provision of the support plate and the attachment portion. However, in this case, since the thickness of the fluorescent member is increased and thus the dissipation of the heat is reduced, the thickness of the fluorescent member is preferably reduced by the provision of the attachment portion.

Although, in the first and third embodiments, the description has been given of the example where the light collection member is inclined toward the side opposite to the light projection direction with respect to the normal to the application surface of the fluorescent member, the present invention is not limited to this example. The light collection member may be inclined in another direction with respect to the normal to the application surface of the fluorescent member.

For example, the application surface of the fluorescent member may be circular, elliptical, square, rectangular or polygonal.

Although, in the embodiments described above, the description has been given of the example where the light emission surface of the light collection member is formed with the flat surface, the present invention is not limited to this example, and the light emission surface may be formed with a surface other than the flat surface.

Although, in the embodiments described above, the description has been given of the case where the light projection direction is, for example, the horizontal direction, the present invention is not limited to this case, and the light projection direction does not need to be the horizontal direction.

Although, in the first and third embodiments, the description has been given of the case where the upper surface of the attachment member is horizontal, the present invention is not limited to this case, and the upper surface of the attachment member does not need to be horizontal.

Although, in the first and third embodiments, the description has been given of the case where the opening surface of the reflective member is perpendicular to the light projection direction, the present invention is not limited to this case. The opening surface of the reflective member does not need to be perpendicular to the light projection direction. The opening surface of the reflective member may be, for example, a curved surface (an uneven surface).

Although, in the embodiments described above, the description has been given of the example where the laser light entering the light entrance surface of the light collection member is reflected off the second reflective surface (the upper surface, the lower surface, the side surfaces), and is guided to the light emission surface, the present invention is not limited to this example. For example, the light collection member is formed such that, as with a graded index optical fiber, the refraction index is decreased either smoothly or stepwise from the inside to the outside, and thus the direction of travel of the laser light is changed within the light collection member, with the result that the laser light may be guided to the light emission surface.

Figure 36:
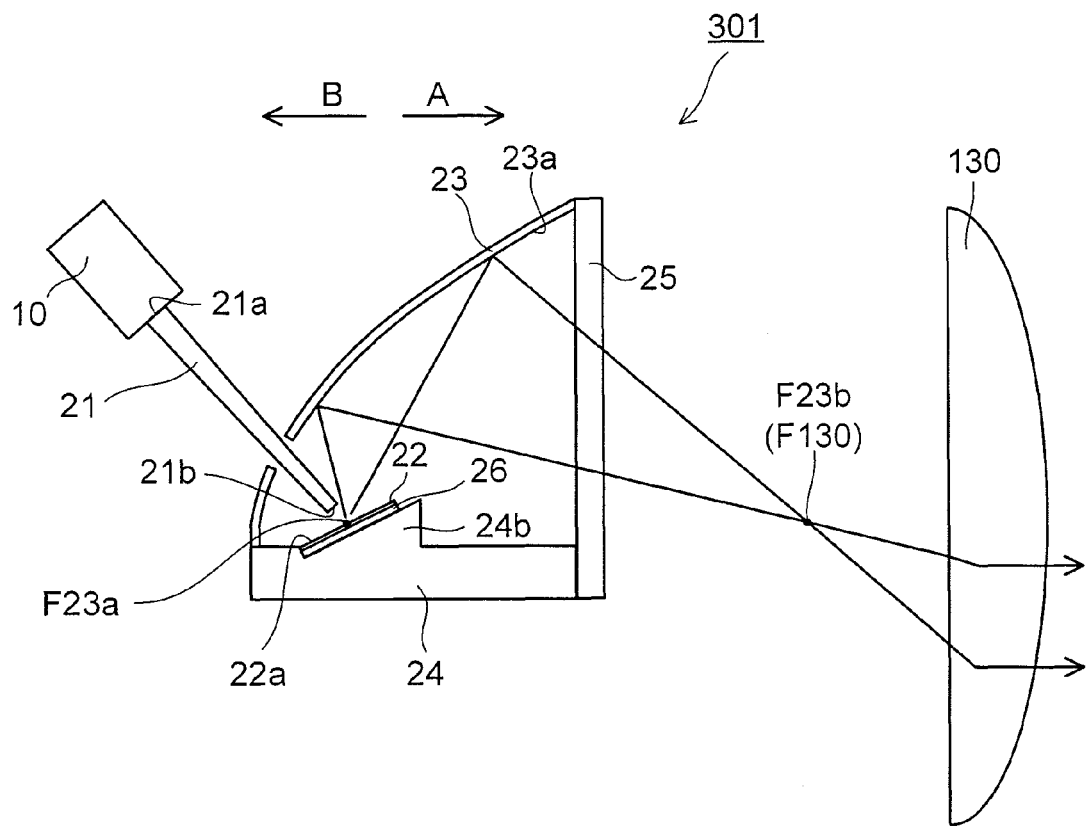
FIG. 36 is a cross-sectional view showing the structure of a light projection device according to a first variation of the present invention.

Although, for example, in the second embodiment described above, the description has been given of the example where the reflective surface 23a of the reflective member 23 is formed to be circular as seen in the light projection direction (A direction), the present invention is not limited to this example. For example, as with a light projection device 301 of a first variation of the present invention shown in FIG. 36, the reflective surface 23a of the reflective member 23 may be formed to include part of the elliptical surface and also formed to be substantially semicircular as seen in the light projection direction. In the light projection device 301, as in the second embodiment, the first focus point F23a of the reflective surface 23a of the reflective member 23 is arranged to substantially coincide with the point Se of the application region S of the fluorescent member 22. The focus point F130 of the lens 130 and the second focus point F23b of the reflective surface 23a of the reflective member 23 substantially coincides with each other. The upper portion of the lens 130 may be omitted.

Figure 37:
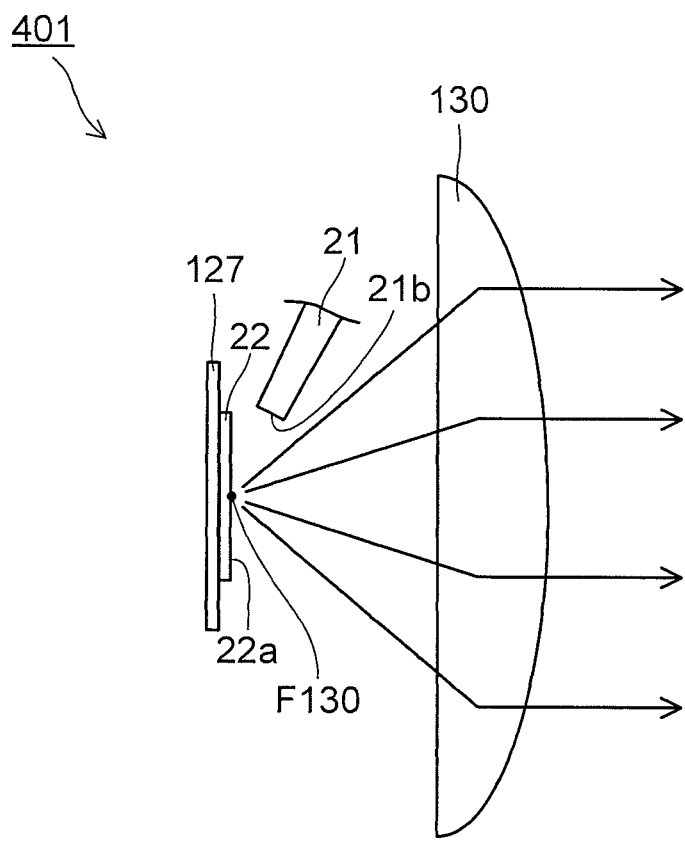
FIG. 37 is a cross-sectional view showing the structure of a light projection device according to a second variation of the present invention.
Figure 38:
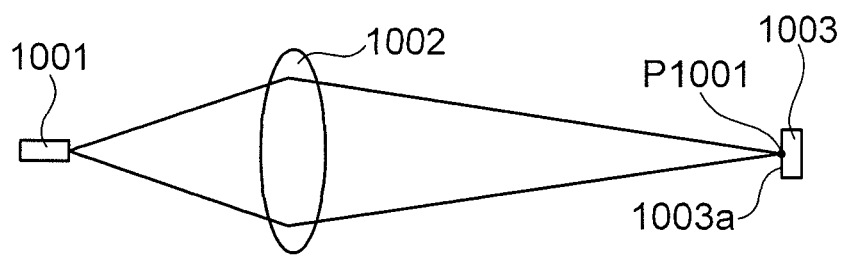
FIG. 38 is a diagram illustrating a problem occurring when the laser light is applied through a light collection lens to the fluorescent member.
Figure 39:
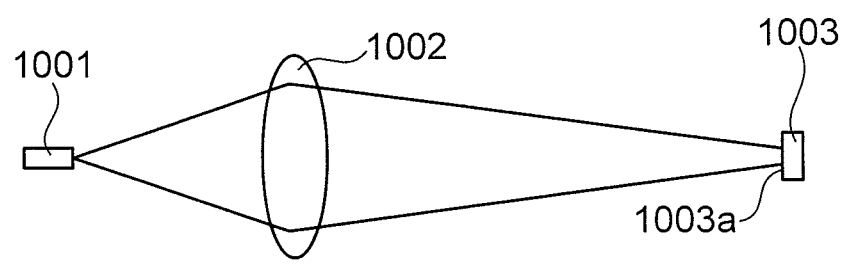
FIG. 39 is a diagram illustrating the problem occurring when the laser light is applied through the light collection lens to the fluorescent member.
Figure 40:
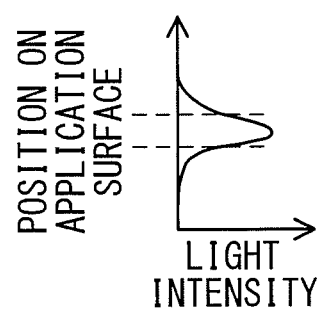
FIG. 40 is a diagram showing the light intensity distribution of the laser light on the application surface.

Although, in the embodiments described above, the description has been given of the example where the reflective member 23 is provided, the present invention is not limited to this example. For example, as with a light projection device 401 of a second variation of the present invention shown in FIG. 37, the laser light may be applied from the side of the lens 130 to the fluorescent member 22, and the light emitted from the application surface 22a of the fluorescent member 22 may be projected by the lens 130 without the use of the reflective member 23. The focus point F130 of the lens 130 is arranged in the application region S. With this configuration, the shape of the application region S is easily reflected on the light projection pattern P formed by the lens 130. When the light is projected with the lens 130, as compared with the case where the light is projected with the reflective member 23 without the provision of the lens 130, the shape of the application region S is easily reflected on the light projection pattern P.

Although, in the second and third embodiments, the description has been given of the example where, without the use of a light blocking plate, the light projection pattern is formed in the shape obtained by cutting the upper right portion, the present invention is not limited to this example. For example, a light blocking plate may be provided between the reflective member (or the fluorescent member) and the lens. With this configuration, it is possible to more rapidly switch the light and dark areas in the edge portion of the light projection pattern or to obtain a more complicated light projection pattern. Since, as in the second and third embodiments, the light emission surface of the light collection member is formed in a shape corresponding to the light projection pattern, and thus it is possible to previously set the shape of the application region and the light projection pattern, the amount of light that is blocked by the light blocking plate can be reduced. Thus, it is possible to reduce the decrease in the efficiency of utilization of the light.

Although, in the second and third embodiments, the description has been given of the example where the light projection pattern having the upper right portion cut is obtained in the case of the use in the country of the left-side driving such as Japan, the present invention is not limited to this example. In the case of the use in the country of the right-side driving, the shape of the light emission surface of the light collection member is revered in the left/right direction, and thus it is possible to obtain a light projection pattern in which an upper left portion is cut.

Configurations that are obtained by combining, as appropriate, the configurations of the embodiments and the variations described above are also included in the technical scope of the present invention.

What is claimed is:

1. A light projection unit that projects light in a predetermined direction, the light projection unit comprising:
   a light collection member that includes a light entrance surface which laser light enters, and a light emission surface which has an area smaller than an area of the light entrance surface and from which the laser light is emitted;
   a fluorescent member that includes an incident surface on which the laser light emitted from the light collection member is incident, that converts at least a part of the laser light into fluorescent light and that mainly emits the fluorescent light from the incident surface; and
   a light projection member that projects the fluorescent light emitted from the fluorescent member,
   wherein the light collection member has a function of changing, therewithin, a direction of travel of the laser light entering the light entrance surface and of guiding the laser light to the light emission surface,
   the light emission surface of the light collection member is arranged a predetermined distance away from the incident surface of the fluorescent member,
   the incident surface is planar, and
   a center axis at a light emission end of the light collection member is inclined at an angle that is equal to or more than 10 degrees and equal to or less than 30 degrees with respect to a normal to the planar incident surface of the fluorescent member.

2. The light projection unit of claim 1,
   wherein the light projection member includes a reflective member that has a first reflective surface which reflects the fluorescent light emitted from the fluorescent member.

3. The light projection unit of claim 1,
   wherein the center axis at the light emission end of the light collection member is inclined toward a side opposite to the predetermined direction with respect to a normal to the incident surface of the fluorescent member.

4. The light projection unit of claim 1,
   wherein the incident surface of the fluorescent member is inclined toward a side opposite to a light projection direction with respect to the predetermined direction.

5. The light projection unit of claim 4,
   wherein the incident surface of the fluorescent member is inclined at an angle that is more than 0 degrees but equal to or less than 30 degrees with respect to the predetermined direction.

6. The light projection unit of claim 1,
   wherein the fluorescent member contains a fluorescent body, and
   a volume occupation rate of the fluorescent body in the fluorescent member is 90% or more.

7. The light projection unit of claim 1,
   wherein light intensity distribution of the fluorescent light emitted from the fluorescent member is Lambertian distribution.

8. The light projection unit of claim 7,
   wherein a thickness of the fluorescent member is one-tenth or less of an overall dimension of the incident surface.

9. The light projection unit of claim 7,
wherein the incident surface of the fluorescent member is sufficiently larger than a spot region of the laser light to incident on the application surface.

10. The light projection unit of claim 1,
wherein the fluorescent member includes an incident region on which the laser light is incident, and
the incident region is asymmetrical in a direction that intersects the predetermined direction.

11. The light projection unit of claim 1,
wherein the fluorescent member includes an incident region on which the laser light is incident, and
a focus point of the light projection member is arranged in an edge portion of the incident region.

12. The light projection unit of claim 11,
wherein the light projection unit is used as a headlight for an automobile, and
the focus point of the light projection member is arranged in the edge portion of the incident region, from which a cut-off line of a light projection pattern is projected.

13. The light projection unit of claim 12,
wherein the focus point of the light projection member is arranged in a position of the incident region, from which an elbow point of the light projection pattern is projected.

14. The light projection unit of claim 1,
wherein the light emission surface is asymmetrical in a direction that intersects the predetermined direction.

15. The light projection unit of claim 14,
wherein the light projection unit is used as a headlight for an automobile, and
the light emission surface is formed in a shape corresponding to a light projection pattern of a passing headlight.

16. The light projection unit of claim 2,
wherein the first reflective surface is formed to include at least a part of any one of a paraboloidal surface and an elliptical surface.

17. The light projection unit of claim 1,
wherein the light projection member includes a lens that transmits the fluorescent light emitted from the fluorescent member,
the fluorescent member includes an incident region on which the laser light is incident and
a focus point of the lens is arranged in the incident region.

18. The light projection unit of claim 1,
wherein laser light emitted from a plurality of laser generators enters the light entrance surface of the light collection member.

19. The light projection unit of claim 1,
wherein the light emission surface of the light collection member is arranged a distance that is equal to or more than 0.3 mm but equal to or less than 1.1 mm away from the incident surface of the fluorescent member.

\* \* \* \* \*